(12) United States Patent
Carr

(10) Patent No.: US 11,231,382 B2
(45) Date of Patent: Jan. 25, 2022

(54) INTEGRATED THERMAL SENSOR COMPRISING A PHOTONIC CRYSTAL

(71) Applicant: William N. Carr, Cary, NC (US)

(72) Inventor: William N. Carr, Cary, NC (US)

(*) Notice: Subject to any disclaimer, the term of this patent is extended or adjusted under 35 U.S.C. 154(b) by 0 days.

(21) Appl. No.: 16/501,641

(22) Filed: May 16, 2019

(65) Prior Publication Data

US 2020/0018714 A1 Jan. 16, 2020

Related U.S. Application Data

(63) Continuation-in-part of application No. 16/221,500, filed on Dec. 15, 2018, now abandoned, which is a continuation-in-part of application No. 15/632,462, filed on Jun. 26, 2017, now abandoned, which is a continuation-in-part of application No. 15/624,625, filed on Jun. 15, 2017, now abandoned.

(60) Provisional application No. 62/043,376, filed on Jun. 15, 2016, provisional application No. 62/742,405, filed on Oct. 7, 2018.

(51) Int. Cl.
| | |
|---|---|
| *H01J 49/02* | (2006.01) |
| *G01N 27/12* | (2006.01) |
| *H01L 27/16* | (2006.01) |
| *G01N 27/414* | (2006.01) |
| *G02B 6/10* | (2006.01) |
| *B82Y 20/00* | (2011.01) |
| *B82Y 15/00* | (2011.01) |
| *G01N 27/18* | (2006.01) |
| *G01N 27/22* | (2006.01) |
| *G01N 25/18* | (2006.01) |
| *G01J 5/20* | (2006.01) |

(52) U.S. Cl.
CPC .............. *G01N 27/18* (2013.01); *B82Y 15/00* (2013.01); *B82Y 20/00* (2013.01); *G01J 5/20* (2013.01); *G01N 25/18* (2013.01); *G01N 27/125* (2013.01); *G01N 27/22* (2013.01); *G01N 27/4141* (2013.01); *G02B 6/107* (2013.01); *H01J 49/025* (2013.01); *H01L 27/16* (2013.01)

(58) Field of Classification Search
None
See application file for complete search history.

(56) References Cited

U.S. PATENT DOCUMENTS

| | | |
|---|---|---|
| 2,462,946 A | 3/1949 | Coggeshall et al. |
| 2,764,021 A | 9/1956 | Sims et al. |
| 3,711,771 A | 1/1973 | Hume et al. |

(Continued)

OTHER PUBLICATIONS

Cui et al., "Nanowire nanosensors for highly sensitive and selective detection of biological and chemical species", 2001, Science, vol. 293, pp. 1289-1292.

(Continued)

*Primary Examiner* — Neil N Turk
(74) *Attorney, Agent, or Firm* — Kaplan Breyer Schwarz, LLP

(57) ABSTRACT

An integrated thermal sensor comprising photonic crystal elements that enable photonic elements for photonic sourcing, spectral switching and filtering, sensing of an exposed analyte and detection. In embodiments, applications are disclosed wherein these photonic elements provide a spectrophotometer, a photonic channel switch and a standalone sensor for toxic gases and vapors. An application coupled with a mobile phone is disclosed.

24 Claims, 27 Drawing Sheets

(56) References Cited

U.S. PATENT DOCUMENTS

| | | | | |
|---|---|---|---|---|
| 3,812,717 | A * | 5/1974 | Miller | G01K 7/01 374/178 |
| 4,101,781 | A * | 7/1978 | Neukermans | C09K 11/628 250/483.1 |
| 5,784,400 | A | 7/1998 | Joannopoulos et al. | |
| 6,060,327 | A | 5/2000 | Keen | |
| 6,917,431 | B2 * | 7/2005 | Soljacic | B82Y 20/00 356/477 |
| 7,072,547 | B2 * | 7/2006 | Assefa | B82Y 20/00 385/15 |
| 7,205,764 | B1 | 4/2007 | Anderson et al. | |
| 7,307,732 | B2 * | 12/2007 | Beausoleil | B82Y 20/00 356/477 |
| 7,474,811 | B1 * | 1/2009 | Quitoriano | G02B 6/1225 385/129 |
| 7,836,566 | B1 | 11/2010 | Olsson et al. | |
| 7,948,041 | B2 | 5/2011 | Bryant et al. | |
| 8,017,923 | B2 | 9/2011 | Inoue et al. | |
| 8,094,023 | B1 | 1/2012 | El-Kady et al. | |
| 8,492,737 | B2 | 7/2013 | Araci et al. | |
| 8,508,370 | B1 | 8/2013 | El-Kady et al. | |
| 8,552,380 | B1 | 10/2013 | Florin et al. | |
| 9,006,857 | B1 | 4/2015 | Carr | |
| 9,103,775 | B2 | 8/2015 | Bradley et al. | |
| 9,164,026 | B2 * | 10/2015 | Chakravarty | G01N 21/7746 |
| 9,214,604 | B2 | 12/2015 | Ali et al. | |
| 9,236,552 | B2 | 1/2016 | Carr | |
| 9,291,297 | B2 | 3/2016 | Allen et al. | |
| 9,496,313 | B2 | 11/2016 | Edwards et al. | |
| 9,722,165 | B2 | 8/2017 | Carr | |
| 9,772,062 | B2 | 9/2017 | Allen et al. | |
| 9,799,798 | B1 | 10/2017 | Luk et al. | |
| 9,817,130 | B1 | 11/2017 | Carr | |
| 10,008,373 | B1 | 6/2018 | Carr | |
| 2004/0119129 | A1 * | 6/2004 | Giboney | H01L 31/101 257/458 |
| 2004/0190915 | A1 | 9/2004 | Murray et al. | |
| 2006/0286488 | A1 | 12/2006 | Rogers et al. | |
| 2007/0101813 | A1 | 5/2007 | Cai et al. | |
| 2007/0140638 | A1 * | 6/2007 | Yang | G01N 21/658 385/132 |
| 2008/0278728 | A1 * | 11/2008 | Tetz | G01N 21/554 356/445 |
| 2010/0056892 | A1 | 3/2010 | Ben-Barak et al. | |
| 2010/0126548 | A1 | 5/2010 | Jang et al. | |
| 2010/0282617 | A1 | 11/2010 | Rothberg et al. | |
| 2011/0045660 | A1 | 2/2011 | Romano et al. | |
| 2011/0263036 | A1 | 10/2011 | Blauw et al. | |
| 2011/0279334 | A1 | 11/2011 | Smith et al. | |
| 2012/0149126 | A1 * | 6/2012 | Wilson | C12N 13/00 436/175 |
| 2012/0206726 | A1 * | 8/2012 | Pervez | G01J 3/0205 356/402 |
| 2013/0005606 | A1 * | 1/2013 | Chakravarty | G01N 21/255 506/9 |
| 2013/0176554 | A1 * | 7/2013 | Loncar | G01J 3/26 356/51 |
| 2013/0284612 | A1 | 10/2013 | Park et al. | |
| 2014/0061486 | A1 * | 3/2014 | Bao | G02B 1/02 250/370.01 |
| 2014/0170392 | A1 | 6/2014 | Allen et al. | |
| 2014/0202515 | A1 | 7/2014 | Haase | |
| 2014/0326902 | A1 | 11/2014 | Tahan et al. | |
| 2014/0378328 | A1 | 12/2014 | Chakravarty et al. | |
| 2015/0124252 | A1 | 5/2015 | Pervez et al. | |
| 2015/0124336 | A1 | 5/2015 | Kaufman | |
| 2015/0207052 | A1 | 7/2015 | Carr | |
| 2016/0054343 | A1 | 2/2016 | Holmes et al. | |
| 2016/0240762 | A1 | 8/2016 | Carr | |
| 2016/0271870 | A1 * | 9/2016 | Brown, Jr. | B33Y 30/00 |
| 2016/0334327 | A1 * | 11/2016 | Potyrailo | G01N 21/783 |
| 2017/0194308 | A1 | 7/2017 | Evans et al. | |
| 2017/0194398 | A1 * | 7/2017 | Kim | H01L 27/3218 |
| 2018/0031171 | A1 | 2/2018 | Allen et al. | |

OTHER PUBLICATIONS

Examiner initiated interview summary (PTOL-413B) dated Mar. 23, 2018 for U.S. Appl. No. 15/805,698.

Notice of Allowance and Fees Due (PTOL-85) dated Mar. 23, 2018 for U.S. Appl. No. 15/805,698.

Requirement for Restriction/Election dated Mar. 12, 2021 for U.S. Appl. No. 16/540,184.

Notice of Allowance and Fees Due (PTOL-85) dated Aug. 3, 2021 for U.S. Appl. No. 16/540,184.

* cited by examiner

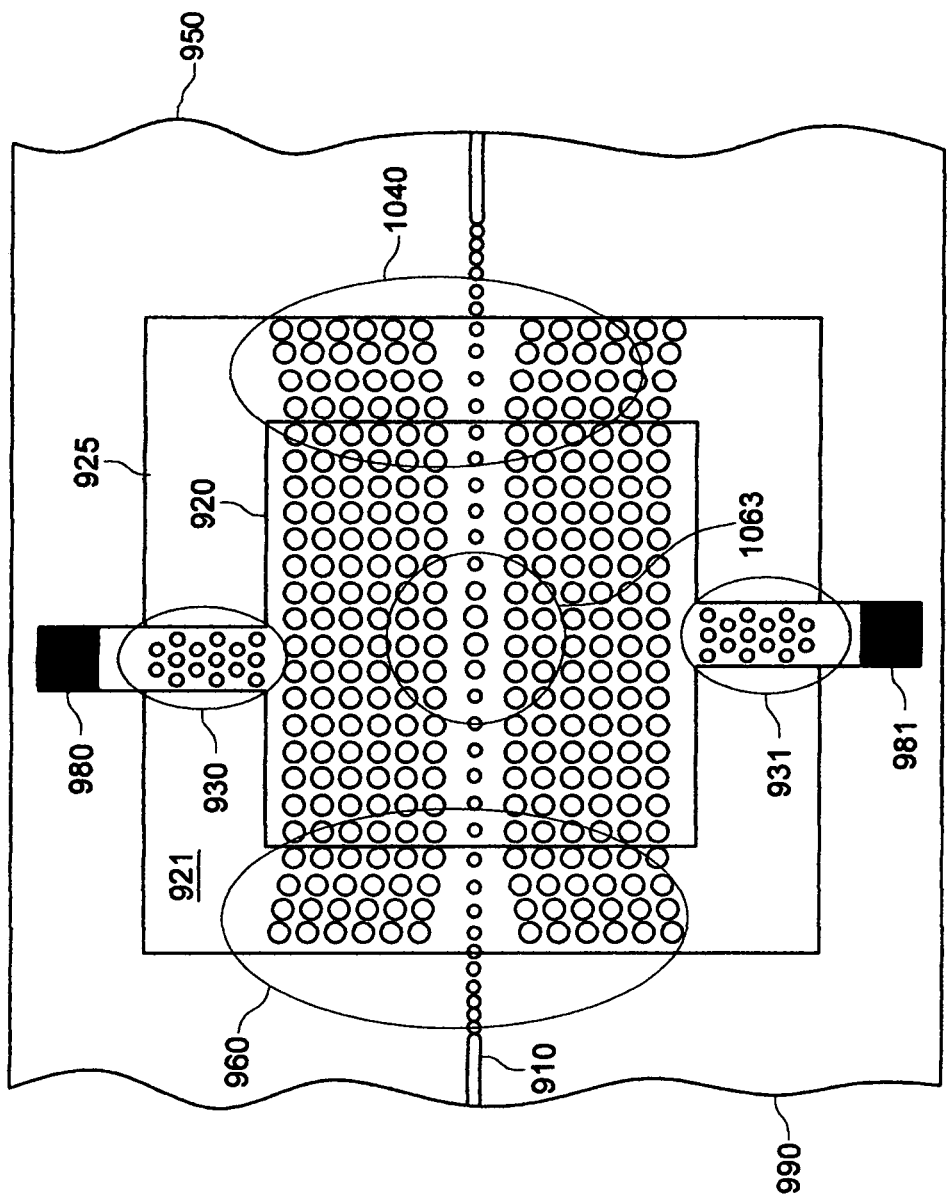

US 11,231,382 B2

INTEGRATED THERMAL SENSOR COMPRISING A PHOTONIC CRYSTAL

STATEMENT OF RELATED CASES

This case is a continuation-in-part of U.S. patent application Ser. No. 16/221,500 filed Dec. 15, 2018, U.S. patent application Ser. No. 15/632,462 filed Jun. 26, 2017, U.S. Pat. No. 15,727,249 filed Oct. 6, 2017, and U.S. patent application Ser. No. 15/805,698 filed Nov. 7, 2017. This case claims benefit of U.S. Provisional Application No. 62/493,147 filed Mar. 29, 2016 and U.S. Provisional Application No. 62/043,376 filed Jun. 15, 2016. These cases are incorporated herein by reference. If there are any contradictions or inconsistencies in language between these applications and one or more cases incorporated by reference that might affect the interpretation of the claims in this case, the claims in this case should be interpreted to be consistent with the language in this case.

FIELD OF THE INVENTION

This invention relates generally to an integrated thermal sensor with integrated photonic and phononic structures.

BACKGROUND OF THE INVENTION

In prior art a photonic integrated apparatus is disclosed in Taillaert et al, U.S. Pat. No. 7,065,272 wherein a photonic signal is guided through a photonic crystal waveguide into a detector. From this patent, FIG. 1A discloses diffraction grating 120, illuminated from a photonic source external to the grating, launches a photonic signal which propagates successively through a tapered-slab waveguide 110, a conventional slab waveguide and on into a photonic crystal waveguide (PCW) 130. FIG. 1B depicts the PS with an exiting signal provided through slab waveguide 160. A 2-D diffraction grating 150, illuminated from an external photonic source, launches a photonic signal which propagates successively through a tapered slab waveguide 140 and into a conventional photonic waveguide PW.

Prior art is disclosed in Notomi et al, U.S. Pat. No. 6,643,439 for a photonic crystal waveguide (PCW) comprised of a holey core guide 220. FIG. 2A depicts a PCW comprising a holey core guide 220 with cladding 210, 230. FIG. 2B depicts a PCW wherein the core guide 250 is not structured and with cladding 240, 260. The photonic crystal cladding structures adjacent to the core guide creates a lower effective refractive index compared to the refractive index of the core structure thereby confining the propagating signal to the core. No thermal elements or controls are disclosed.

A prior art photonic crystal waveguide (PCW) is coupled to entrance 330 and exit waveguides 300 in Assefa et al, U.S. Pat. No. 7,072,547. An impedance matching coupling 340 between the slab photonic waveguide PW 330 and the photonic crystal waveguide 200A is provided by resonators 310 of varying spatial pitch. The coupling structure 310 is characterized by limited wavelength bandpass. An adiabatic introduction of the photonic crystal reduces reflections at the edges and reduces Fabry-Perot resonance in the overall structure. The coupler applies to PCWs with 2-D cladding comprised of holes and with square, triangular and hexagonal crystal lattice geometries. These structures are types of a photonic crystal waveguide sensor and are usually operated in the slow-mode wavelength region.

FIGS. 4A and 4B depict another prior art photonic crystal waveguide (PCW) having high-Q resonant cavities 410, 420, 470 disposed within the evanescent field but outside the slab cores 400 and 460. The photonic crystal waveguide PCW is comprised of a first cladding structures 440, 450, 480, 490. The 'defect" cavity structures 420, 420, 470 in the cladding provide an impedance to the core which is especially sensitive to material in close proximity thereby providing a sensor.

In other prior art, a PCW comprising a Mach-Zehnder interferometer is disclosed in U.S. Pat. No. 6,917,431 as in FIG. 4C. Photonic crystal waveguide 430 couples with a high-Q resonant cavity 435. The propagating phase delay of signal from entrance port 405 continues through M-Z guide 425 and 430 with delay structure 435. The PCW is comprised of cladding 445, 455. The phase delay through guide 430 is sensitive to minute changes in the refractive index associated with resonant cavity 435. An analyte of interest exposed to the resonant cavity 435 modulates the phase delay in core arm 430. When the two signals are combined into the exit guide 415, a photonic signal responsive to proximal analyte material is provided.

FIG. 5 depicts a prior art absorbing boundary used to terminate a photonic crystal waveguide PCW. In this structure spurious reflections from a photonic signal wave entering the core 510 are suppressed by a perfectly matched Bragg reflectance structure 520. The wave propagating from 510 through the core slab is terminated with no reflection, dissipating as heat into the termination 520. Photonic structures 530 and 540 comprise cladding for photonic signal propagating from the input port 510 into the termination structure 520.

FIG. 6 depicts prior art disclosed in U.S. Pat. No. 9,164,026 disclosing PCW signal-splitting structure 620 providing multiple fanouts 640 through PCW couplers 630 from photonic input port 610. The chip is comprised of input and output grating couplers 610, 640 for an external photonic source (PS) and an external load circuit, respectively.

In related prior art, a spectrophotometer apparatus comprised of discrete components including an optical waveguide coupled to a photonic crystal of dielectric material is disclosed by Pervez et al in U.S. Patent Application 2015/0124252. The photonic crystal is located on an exterior surface of an optical slab waveguide within the apparatus. The photonic crystal is configured to provide a weakly-coupled-mode coupling with a material of interest. A photonic signal propagating through the waveguide is affected by said coupling terminates in a detector.

In related prior art, an optical sensing device comprised of discrete components including a 2-dimensional plasmonic optical filter wherein an optical beam is focused via discrete optics orthogonal to the plane of the filter is disclosed by Tetz et al in U.S. Patent Application 2008/0278728. An analyte of fluidic material including biomedical material is provided in contact with different areas of the plasmonic optical filter. A detector comprising a CCD is disclosed. Optical signal propagation through a photonic waveguide with or without a slow wave condition is not disclosed.

In related prior art, Brown in U.S. Patent Application 2016/0271870 discloses an apparatus wherein a phonon flux is generated in a bulk material disposed within a build chamber when exposed to an acoustic source of energy, generally of ultrasonic nature.

Evans et al in U.S. Patent Application 2017/0194308 discloses an integrated circuit package having a photonic integrated circuit (PIC) comprising optical devices on a single chip. In embodiments, a waveguide optical access including a buried waveguide core, TW waveguide photodiodes and a lumped photodetector are disclosed. External thermoelectric coolers (TECs) may be employed to cool the integrated circuit package.

A stable fiber optic scintillative x-ray screen is disclosed by Neukermans et al in U.S. Pat. No. 4,101,781 wherein an oven is heated with quartz lamp heaters to provide outgassing of TlI and CsI within a closed scintillator.

An apparatus for measuring temperature using the PTAT method comprising a semiconductor forward biased junction and a bridge phase detector is disclosed in Miller et al U.S. Pat. No. 3,812,717.

Giboney in U.S. Patent Application 2004/0119129 discloses a unipolar photodiode having a Schottky junction contact providing a direct photon to electron conversion.

Prior art relating to a thermal infrared source is disclosed in X. Liu et al, "Taming the blackbody with metamaterials", Phys. Rev. Letters, vol 107, 045901 (July, 2011), doi: 10.1103/PhysRevLett.107.045901. A patterned metamaterial metallic resonator having micron-dimensions is disclosed wherein blackbody radiation is filtered to provide a photonic source with limited bandwidth.

The prior art listed above does not disclose a thermal micro-platform supported by nanowires, wherein the nanowires comprise phononic scattering structure and/or phononic resonant structure physically adapted to reduce thermal conductivity. The prior art listed above does not disclose a PCW-based sensor wherein phononic structure provides an increase in thermal isolation for a photonic element. The prior art listed above does not disclose a semiconductor structure providing an increase in the ratio of electrical conductivity to thermal conductivity.

SUMMARY OF THE INVENTION

An objective of this invention is to provide an integrated thermal sensor comprising integrated photonic and phononic structural elements comprising a photonic source, sensor/modulator and detector. The basic photonic elements of the integrated thermal sensor are a photonic source (PS), a photonic crystal waveguide filter (PCWF), a photonic crystal waveguide sensor (PCWS) and a photonic crystal waveguide detector (PCWD). In embodiments, one or more of the PS, PCWF, PCWS and PCWD comprises a thermal micro-platform. In some embodiments, a system-on-chip (SoC) comprises one or more of the photonic elements. In some embodiments, the integrated thermal sensor provides a means for identification based on unique spectral signatures of gases, vapors, liquids, particulates, and biomolecular material. In embodiments the integrated thermal sensor is adapted to provide spectral analysis within a selected wavelength range at a monitored or controlled temperature for an analyte undergoing a chemical or biological process. In another embodiment, the integrated photonic sensor provides a photonic multiplexer wherein channel switching is implemented using a heated thermal micro-platform.

A second objective of the invention is to provide an on-chip sensor comprised of an integrated PCW and a thermal detector for biomedical analysis. In this embodiment, a multiplicity of sampling cells, each sensitive to one or more specific wavelengths, dilution levels and molecular densities, comprise an analyte. The integrated thermal sensor provides data for spectral analysis unique to the analyte of interest.

A third objective of the invention is to provide an integrated thermal sensor comprising a temperature-controlled photonic element disposed on a thermal micro-platform. In embodiments, a micro-platform is heated by a resistive heater device. This permits a more precise spectral analysis of an analyte at multiple temperatures. The thermal micro-platform permits outgassing of analyte residue from the sensor and detector elements thereby providing a "reset" function for calibrations. In some embodiments, the PCWS comprises a means of controlling temperature of the analyte.

A fourth objective of the invention is to provide a thermal sensor based on photonic crystal waveguide structure for identifying and/or monitoring an analyte undergoing a chemical or biological reaction process. A fifth objective of the invention is to provide a thermal micro-platform comprised of both a thermal sensor device and a bandgap diode sensor device, wherein the bandgap diode sensor device provides sensitivity over an increased wavelength spectrum extending to visible wavelengths.

A sixth objective of the invention is to provide a spectrophotometer comprised of a photonic source (PS) which in embodiments comprises a metamaterial spectral filter to provide a photonic carrier signal within a limited wavelength range. A seventh objective of the invention is to provide a switch for photonic signal multiplexing.

A ninth objective of the invention is to provide a cooled micro-platform wherein the photonic crystal waveguide detector (PCWD) comprises a Peltier thermoelectric device and/or is physically configured with thermal isolation structure providing spontaneous blackbody radiative cooling.

The salient elements of the invention include:

An integrated thermal sensor comprising photonic elements, the elements further comprising a photonic source (PS), a photonic crystal waveguide filter (PCWF) and/or a photonic crystal waveguide sensor (PCWS), and a photonic crystal waveguide detector (PCWD) wherein a photonic carrier signal originating from the photonic source (PS) propagates into and through the photonic crystal waveguide filter (PCWF) and/or photonic crystal waveguide sensor (PCWS), and terminates into the photonic crystal waveguide detector (PCWD) and further wherein the integrated thermal sensor further comprises:

a thermal micro-platform, the thermal platform having a support layer that is suspended by nanowires at a perimeter thereof, wherein the support layer comprises device structure;

an off-platform region, the off-platform region surrounding the thermal micro-platform; and a first layer of one or more of the nanowires comprised of a semiconductor having phononic scattering structure and/or phononic resonant structure physically adapted to reduce thermal conductivity, and wherein:

the photonic elements comprise at least one of the thermal micro-platform;

the first layer of the one or more of the nanowires provides an increase in the ratio of electrical conductivity to thermal conductively;

at least two of the photonic elements are connected via one or more of a photonic crystal waveguide (PCW); and the photonic carrier signal is modulated in the photonic crystal waveguide filter (PCWF) or the photonic crystal sensor (PCWS) in response to a device controlling temperature and/or an exposed analyte.

The present invention discloses technology for an integrated thermal sensor comprising integrated photonic and phononic (IP & P) structure. The IP & P structure may comprise any of the thermal elements. In embodiments, the IP & P structure comprises a nanowire providing thermal isolation, electrical conduction, and a photonic waveguide of PW or PCW type. In embodiments, IP & P structure integrates one or more of the photonic elements with a photonic connection between thermal elements comprising a conventional photonic waveguide (PW) or a photonic crystal waveguide (PCW). In other embodiments, the IP & P structure may comprise a PCWS and a PCWD disposed on the same thermal micro-platform.

In all embodiments of the present invention, one or more nanowires comprise a first layer having phononic scattering and/or phononic resonant structures physically configured to reduce thermal conductivity. The effectiveness of phononic structures in reducing thermal conductivity is based on the duality principle in quantum mechanics which stipulates that a phonon can exhibit both wave- and particle-like properties at small scales. These structures reduce heat transport through the phononic nanowire by reducing the mean path for propagating phonons or dissipating phonons via structuring to enhance local resonances. In some of nanowires with periodic nanostructuring, the reduction of phononic heat transport is explained by a phononic bandgap which restricts flow of phonons within an energy range. In embodiments, the phononic structures that reduce thermal transport in the nanowire may be disposed in both random and periodic configurations.

In embodiments of this invention, the dominant mechanisms effecting phonon mean path in the semiconductor nanowires are based on boundary scattering and resonant structures scaled at the atomic, molecular and nanometer level.

In embodiments, the phononic structures are created in several forms. Phononic structures may be formed within a nanowire using deep submicron lithography. In other embodiments, phononic structuring is accomplished by creating a superlattice having intrinsic atomic- and molecular-level boundary scattering, creating scattering structure with E-beam implantation of heavy atoms, or creating local particulates of alloys such as SiGe.

In embodiments, phononic structuring of nanowires is accomplished using a metal-assisted chemical etching to create porous silicon Y. Shao et al, "Ultralow thermal conductivity of single-crystalline porous silicon nanowires", [Adv. Functional Materials, vol. 27, 1702824 (2017)]. Phonons moving in the crystalline part of the nanowire are scattered at the surface of the pores.

In other embodiments, phononic scattering structures within the nanowire may comprise molecular aggregates, implanted atomic species, and structures created by lithographic patterning. Thin films of semiconductor may be physically patterned with decorations to create a phononic crystal (PnC) having a phononic bandgap (see for example, S. Mohammadi et all, *Appl. Phys. Lett.*, vol. 92, (2008) 221905). Phononic bandgaps of PnCs define frequency bands where the propagation of heat-conducting phonons is forbidden. In some embodiments, wherein thermal conductivity of a nanowire is reduced, an array of phononic structures disposed within or on the surface of a nanowire provide layers of PnC. This structuring requires a periodic array of structures such as holes which exhibit elastic (phonon) band gaps. Phonon scattering within a PnC-structured nanowire is obtained by physically configuring the nanowire to reduce the phononic Brillouin zone and in some embodiments extend scattering to include successive PnC arrayed layers or interfaces. Nanowires configured with PnC structures can enhance both incoherent and coherent scattering of heat conducting phonons. PnC structures can provide a Bragg and/or Mie resonance of heat conducting phonons to reduce thermal conductivity. In embodiments of the present invention, most phononic structures, including PnCs and resonant structure, are considered to be a provide a metamaterial nanowire.

In embodiments, Bragg resonant structures can also be provided in silicon nanowires by implanted elements such as Ar and Ge using a metal lithographic mask. Mie resonant structures comprise phonon transport within structures including holes, indentations and cavities within a first nanowire layer. (see M. Ziaci-Moayed, et al "Phononic Crystal Cavities for Micromechanical Resonators", Proc. IEEE 24$^{th}$ Intl Conf. on MEMS, pp. 1377-1381, (2011).

An aspect of the present invention is the physical nanowire adaptation providing phononic scattering and/or resonant structures to reduce the mean free path for thermal energy transport by phonons with limited reduction of nanowire electrical conductivity. The dimensions of phononic scattering structures are disposed with separations sufficient to not limit the longitudinal scattering of electrons and thereby have limited effect on the bulk electrical conductivity of the nanowire. The first layer of one or more of the nanowires increases the ratio of electrical conductivity to thermal conductivity.

In embodiments, the desired phononic scattering and/or resonant structures within nanowires may be created as one or more of randomly disposed and/or periodic arrays of holes, pillars, plugs, cavities, surface structures including quantum dots, implanted elemental species, and embedded particulates. This structuring, in embodiments, comprises a first layer of phononic nanowires reducing the thermal conductivity.

In some embodiments, a first layer of the nanowire is created based on an electrochemical or multisource evaporation process for a semiconductor film deposition and subsequent annealing to provide a porous or particulate-structured film. In other embodiments, a nanowire is selectively ion implanted with an atomic species such as Ar or H to provide scattering structures as imbedded atomic-level structure. Processes for the synthesis of thin films of nanometer thickness with porous, particulate structures, and implanted species is well known to those familiar with the art.

In embodiments, the mean free path for thermal transport ranges from less than 10 nm to over 1000 nm in selected nanowires. These semiconductor nanowires will have electron mean free paths ranging from 1 nm up to 10 nm, much less than for phonons which comprise unstructured mean free paths over 10 nm. In nanowire embodiments, the ratio of thermal to electrical conductivity is advantageously enhanced.

The one or more of the first layer of the nanowires comprise phononic scattering structures and/or phononic resonant structures is physically configured with one or more of holes, cavities, atomic-level superlattices, atomic-level vacancies and engineered particulates. A first layer of the nanowires comprises a semiconductor selected from the group Si, Ge, $ZnO_2$, GaAs, GaN, $Bi_2Te_3$, $CoSb_3$, $Sb_2Te_3$, $La_3Te_4$, SiC, PbTe, $Sb_2T_3$, $VO_x$ and binary/ternary alloys thereof.

In embodiments, some nanowires comprise a second layer in addition to the first layer. This second layer is comprised of an ALD metal film such as, without limitation, one or more of aluminum, copper, tungsten, palladium, platinum, molybdenum, silver and gold providing an increased electrical conductivity.

In embodiments, some nanowires comprise a third layer in addition to the first and second layer, wherein the third layer comprised of a dielectric such as, without limitation, silicon dioxide, silicon nitride, hafnium oxide, silicon oxynitride, aluminum oxide, PMMA and SU-8. In embodiments, the dielectric layer provides an electrical isolation between a first and a second layer and/or control of mechanical stress within nanowires and across the supported thermal micro-platform.

In embodiments, standard photonic waveguide (PW) and/or photonic crystal waveguide (PCW) provides a photonic signal path between at least two photonic elements of the integrated thermal sensor. The cladding of the photonic waveguide (PW) and photonic crystal waveguide (PWC) comprises one or more of air, silicon dioxide, silicon nitride, PDMS, PMMA and organic films.

In some embodiments the infrared source (PS) is disposed physically separate from other photonic elements. In an embodiment, the PS is disposed externally and is coupled into a photonic grating disposed at the entrance port to a substrate comprising the other photonic elements of the integrated thermal sensor. The photonic carrier signal propagates through the cascade of primary photonic elements via secondary photonic elements comprising a conventional photonic waveguide (PW) and/or a photonic crystal waveguide (PCW). In one embodiment, the primary photonic elements PS, PCWF and/or PCWS and PCWD are disposed on a single substrate.

Temperature control with heating of one or more thermal micro-platforms comprising a PS provides a photonic carrier signal within the pixel. Temperature control of a thermal micro-platform comprising a PCWF can provide dynamic photonic beam switching, bandwidth control, wavelength tuning and support for synchronous detection circuitry. In embodiments, temperature control of the thermal micro-platform within any thermal element permits outgassing of any accumulated material such as residue of an analyte. In embodiments, the thermal micro-platform comprises a temperature sensing device providing a means for closed loop temperature control of the platform. In some embodiments, a PCWF element is disposed directly onto a supporting substrate without a micro-platform and temperature control.

The PCWF provides a filter to modulate the photonic carrier signal for delivery to a PCWS. In embodiments, multiple PCWF elements provide a plurality of photonic carrier signals into one or more PCWS elements. In embodiments, the photonic crystal waveguide filter (PCWF) an/or the photonic crystal wavelength sensor (PCWS) controls the amplitude, phase or wavelength channel of the photonic carrier signal.

In some embodiments, the thermal micro-platform is cooled by an integral Peltier thermoelectric device.

In other embodiments, the thermal micro-platform is "self-cooled" wherein the supporting nanowires are physically configured for a minimal thermal conductivity and the micro-platform is disposed within a cavity providing additional thermal isolation. In these embodiments, spontaneous blackbody radiation cools the micro-platform. Blackbody radiation from the micro-platform is not reflected back from the boundaries of the cavity. Cooling of the thermal micro-platform occurs wherein spontaneous blackbody radiated heat exceeds the heat received from supporting nanowires and the surrounding enclosure. In embodiments, the PCWS and/or the PCWD comprise a cooled thermal micro-platform.

In embodiments, temperature sensing devices disposed in a thermal micro-platform provide sensitivity to very minute changes in temperature, a feature especially useful for a PCWD. In embodiments, the thermal temperature sensor within a PCWD is sensitive to changes of temperature less than a microdegree Centigrade. In embodiments, temperature sensing devices are connected into circuits for platform temperature control and calibration purposes. Temperature sensor devices disposed on-platform or off-platform comprise one or more of a Seebeck thermoelectric, pyroelectric, thermistor, VOx, MOS transistor (MOST) and pn junction diode (PTAT or ITAT) device. In embodiments, a pn junction diode device disposed within the PCWD provides a bandgap photonic sensor for visible and NIR photonic carrier signals.

The detectable carrier signal into the PCWD is limited by the photonic signal level available from the photonic source PS, the effective Q of the sensor PCWS, on-chip spurious signal attenuation, thermal noise in the photonic elements, and noise in signal conditioning circuitry. In some embodiments, the photonic source PS and or filter PCWF is configured and operated to provide the synchronizing photonic carrier signal within a synchronized double sampling (SDS) circuit. This synchronizing photonic carrier signal is processed from the PCWD by the demodulator in the SDS circuit. The demodulator may comprise a synchronized switch or a phase locked loop (PLL) circuit. The SDS function is implemented to improve signal-to-noise (S/N) ratio for the integrated thermal sensor.

Attenuation of a propagating photonic wave through the PCWS operated in the slow-wave region is highly sensitive to very small changes in the refractive index of material on or immediately adjacent to a resonant cavity or other photonic absorptive structure. For slow-wave operation, the photonic waveguide within the PCWS is configured to provide a maximum dispersion of refractive index for the propagating signal. This mode of operation is characterized as slow-wave propagation for the photonic carrier signal wherein the wave velocity of signal is reduced. The attenuation of the slow wave is sensitive to minute "defect" variations in effective refractive index provided by resonant cavities within the photonic crystal waveguide.

In embodiments, the integrated thermal sensor is comprised of a photonic crystal waveguide sensor (PCWS) adapted to provide a means of detecting and monitoring minute amounts of an analyte including gases, vapors, and particulates. In embodiments the PWCS comprises a Mach-Zehnder interferometer. The effective permittivity around nanoscale structures in the photonic cores an M-Z interferometer is affected when exposed to an analyte. The amplitude and phase of the photonic carrier signal exiting the PCWS and detected in the PCWD can provide a means of uniquely identifying or monitoring an exposed analyte.

In embodiments, the PCWF, PCWS and PCWD are disposed on the same support structure and, in some cases, integrated into the same thermal micro-platform. In embodiments, the photonic signal propagates via PC and PCW structures from the PS into one or more PCWF or PCWS structures.

Some analytes exposed to the sensor PCWS are characterized by unique absorptive spectra, often resulting from specific molecular vibration resonances at specific wavelengths. These absorptive spectra are temperature dependent. In some instances, the sensitivity to an analyte is increased with a PCWS comprising a heated or cooled thermal micro-platform. In embodiments, the sensor PCWS is comprised of a heater which elevates the temperature of the thermal micro-platform of the PCWS. In other embodiments, the PCWS is cooled by a Peltier thermoelectric device integral to the micro-platform. The photonic carrier signal from a PCWS operated over a temperature range, in embodiments, can provide a desirable increase in overall selectivity and sensitivity for some analytes. This adaptation is especially useful when the PCWS response to a particular chemical species of interest is highly temperature dependent and there are additional interfering species present but with differing temperature response coefficients within the particular wavelength band of sensitivity.

Analytes that can be identified and monitored with embodiments of the invention include, without limitation:
pollutant gases such as greenhouse gases carbon dioxide, carbon monoxide, methane, nitrous oxide, chlorofluorocarbons, and ozone;
volatile organic compounds such as benzene, toluene, xylene, and ethylbenzene;
highly toxic gases such as ammonia, arsine, chlorine, boron tribromide, and sarin;
explosives such as trinitrotoluene (TNT) and RDX;
by-product gases from combustion-engine exhausts, stack exhausts in coal plants, chemical plants and oil refineries; and
products of exothermal and endothermal chemical reactions including biochemical chemistry reactions.

In an exemplary embodiment, the integrated thermal sensor comprises a silicon chip fabricated from a starting silicon SOI wafer. The photonic crystal waveguide PCW, nanowires, and micro-platform may be formed of the device layer of a starting SOI wafer. In embodiments, the device layer of the starting SOI wafer is of high resistivity wherein devices having a low resistivity are formed in this layer using a patterned spin-on dopant. These structures in embodiments comprise semiconductor devices including thermoelectric, thermistor, MOST and other device types. In most embodiments, the sensing device comprises degenerate doping levels to provide a maximum electrical conductivity with increased electrical isolation from other devices disposed into the same semiconductor layer. Also many semiconductor devices comprising low resistivity structure are characterized by an advantageous lower temperature coefficient of resistance (TCE). In embodiments, a resistive heater element in the thermal micro-platform is formed with a patterned spin-on dopant or ALD metal film. These patterned ALD metal films in embodiments may include one or more of a range of metals including Al, Cu, W and Mo. In this exemplary embodiment, nanowires are covered with a dielectric layer of silicon nitride using a CVD deposition process with a silane and ammonia precursor. This stress relief layer also provides an upper cladding film covering selected IP & P coupling structures. Films are patterned using a DRIE etching tool and, in many embodiments, deep submicron lithography. After suitable patterning, the micro-platform is released from the silicon handle wafer using a frontside isotropic HF-vapor etching process or a backside anisotropic DRIE process. In other embodiments, liquid etchants for silicon include TMAH, KOH and EDP. The exemplary process is based on lithography providing structures with controlled dimensions as small as 10 nm. The process technology for fabricating the photonic devices and photonic elements of this invention is well known to those skilled in the art of semiconductor device fabrication.

In embodiments, the integrated thermal sensor is physically configured for operation with photonic carrier signals having wavelengths ranging from less than 0.3 micrometer to over 1 millimeter.

BRIEF DESCRIPTION OF THE FIGS

FIG. 1A depicts a plan view of a prior art photonic diffraction grating configured as a coupler into a photonic crystal waveguide (PCW) providing one type of a photonic source (PS) when supplied by an emitter external to the chip FIG. 1B depicts a plan view of a prior art photonic diffraction grating configured as a coupler into a photonic slab waveguide providing a photonic source (PS) when supplied by an emitter external to the chip.

FIGS. 10A, 10B and 10C depict respective first, second and third plan views of photonic crystal waveguide sensor (PCWS) embodiments in accordance with embodiments of the invention.

Figure 11:
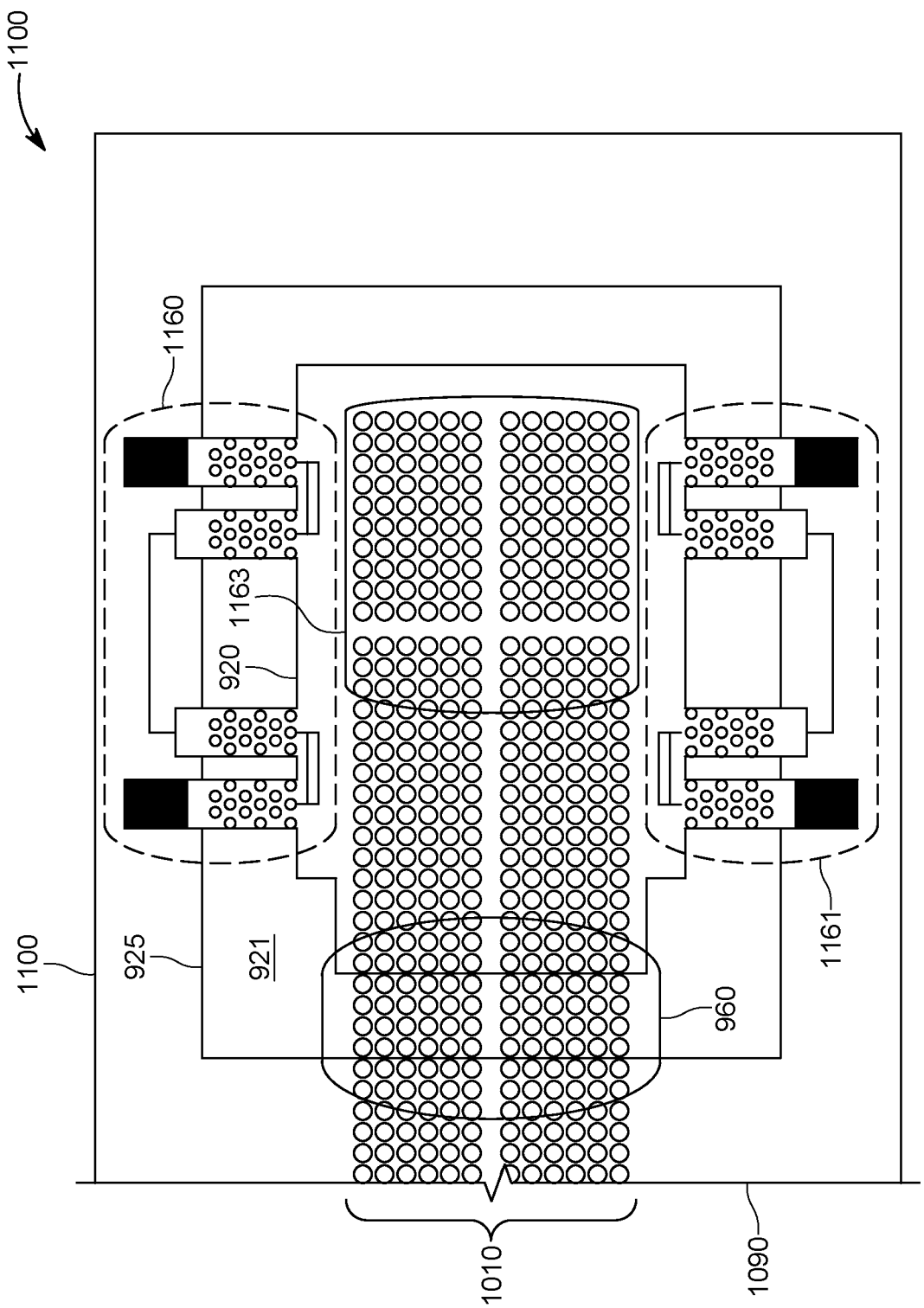

FIG. 11 depicts a plan view of a photonic crystal waveguide detector (PCWD) comprised of a thermally-isolated and thermally-heated micro-platform further comprising a thermoelectric Peltier array and a photonic crystal waveguide (PCW) terminated in a zero-reflecting termination structure and where one PCW supporting nanowire is comprised of integrated photonic and phononic (IP & P) structures in accordance with embodiments of the invention.

Figure 12A:
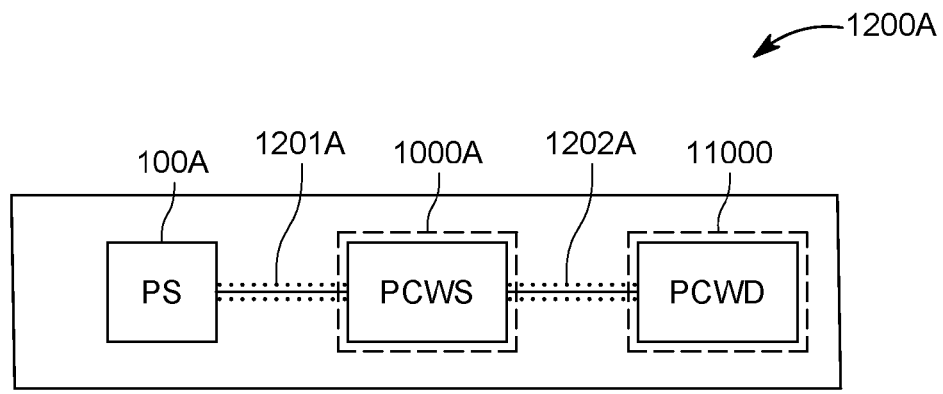

FIG. 12A is a schematic depicting a chip comprising a photonic source (PS), a photonic crystal waveguide sensor (PCWS) and a photonic crystal detector PCWD in accordance with embodiments of the invention.

Figure 12B:
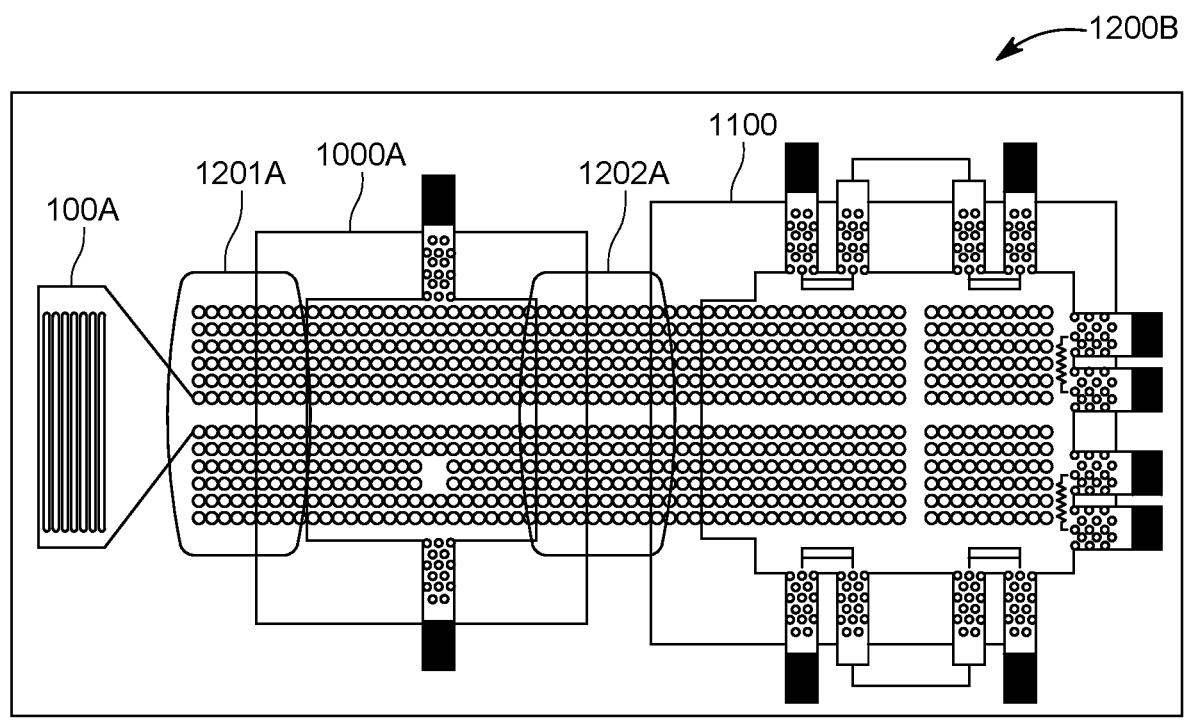

FIG. 12B is a plan view depicting the chip of FIG. 12A comprising a 1D grating photonic source, a sensor micro-platform with a high-Q resonant cavity embedded in the cladding photonic crystal, and a photonic crystal waveguide detector (PCWD) with integrated photonic and phononic (IP & P) structures in accordance with embodiments of the invention.

Figure 13A:
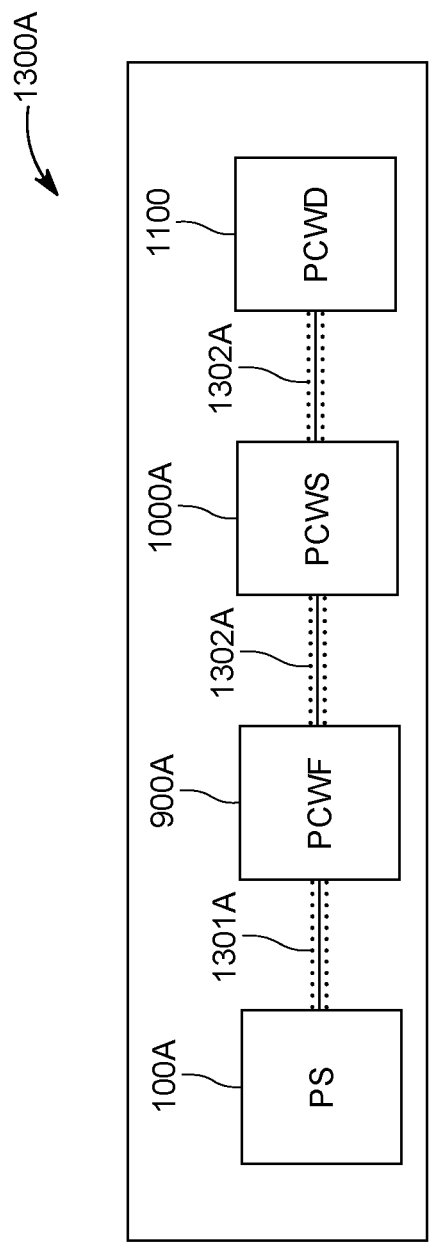

FIG. 13A is a schematic depicting a chip comprising a grating portion of a photonic source (PS), a photonic crystal waveguide filter (PCWF), a photonic crystal waveguide sensor (PCWS) and a photonic crystal detector (PCWD) further comprising three IP & P interposer structures in accordance with embodiments of this invention.

Figure 13B:
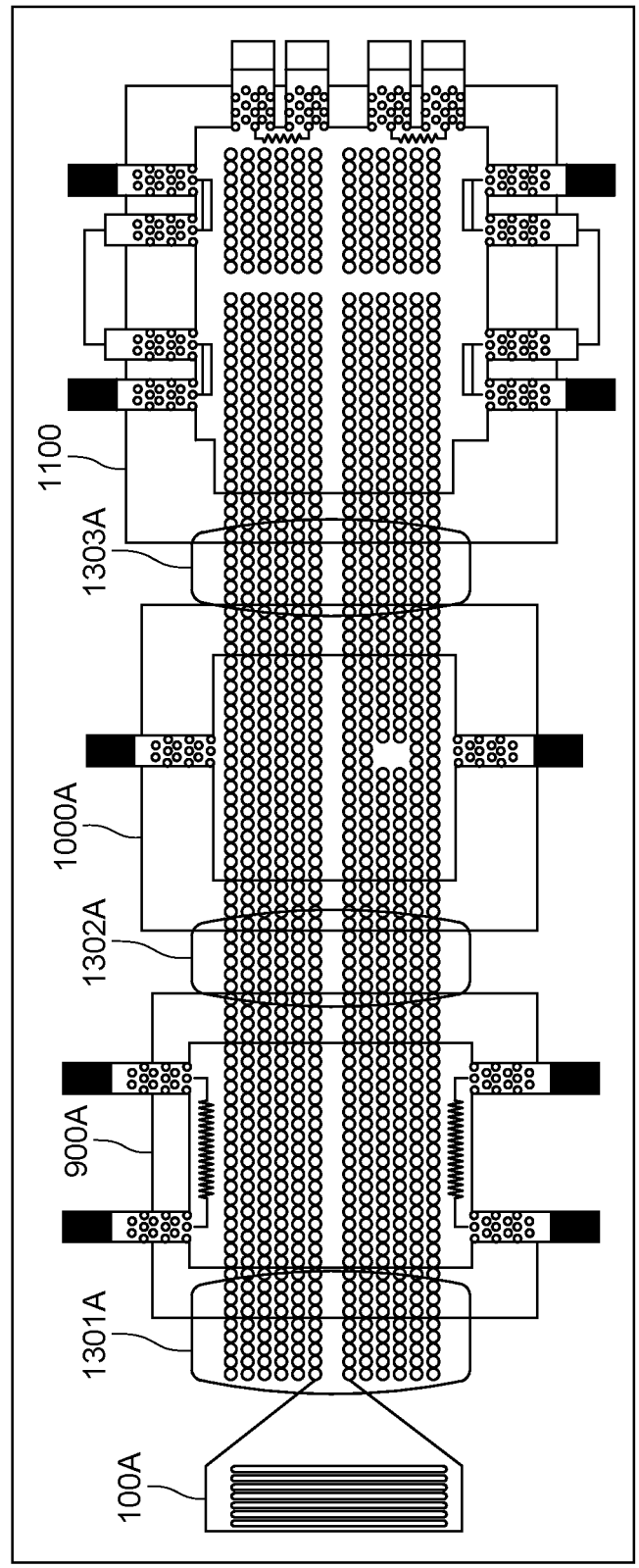

FIG. 13B is a plan view depicting structure of the chip of FIG. 13A.

Figure 14A:
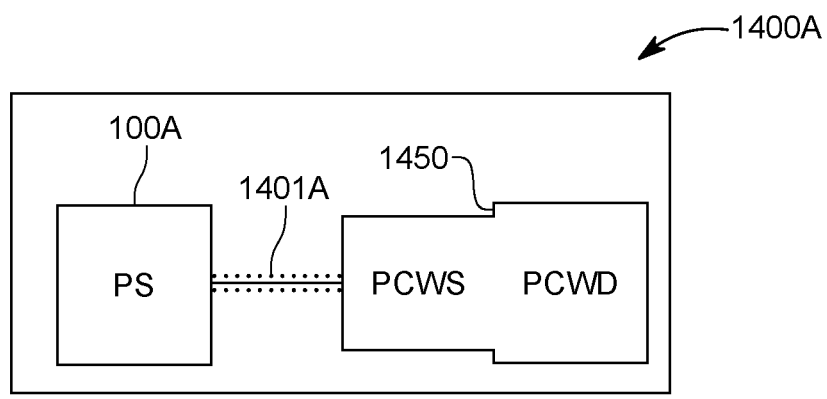

FIG. 14A is a schematic depicting a chip comprised of a photonic source (PS) and with a single micro-platform comprising the sensor (PCWS) and detector (PCWD) in accordance with embodiments of the invention.

Figure 14B:
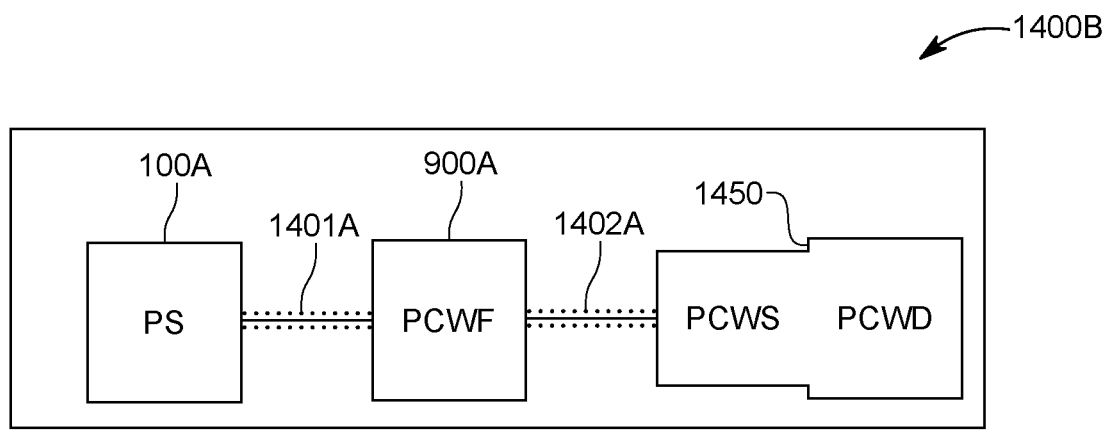

FIG. 14B is a schematic depicting a chip comprised of a photonic source PS, a photonic crystal waveguide filter (PCWF) and a single micro-platform comprising both the sensor (PCWS) and detector (PCWD) in accordance with embodiments of the invention.

Figure 15:
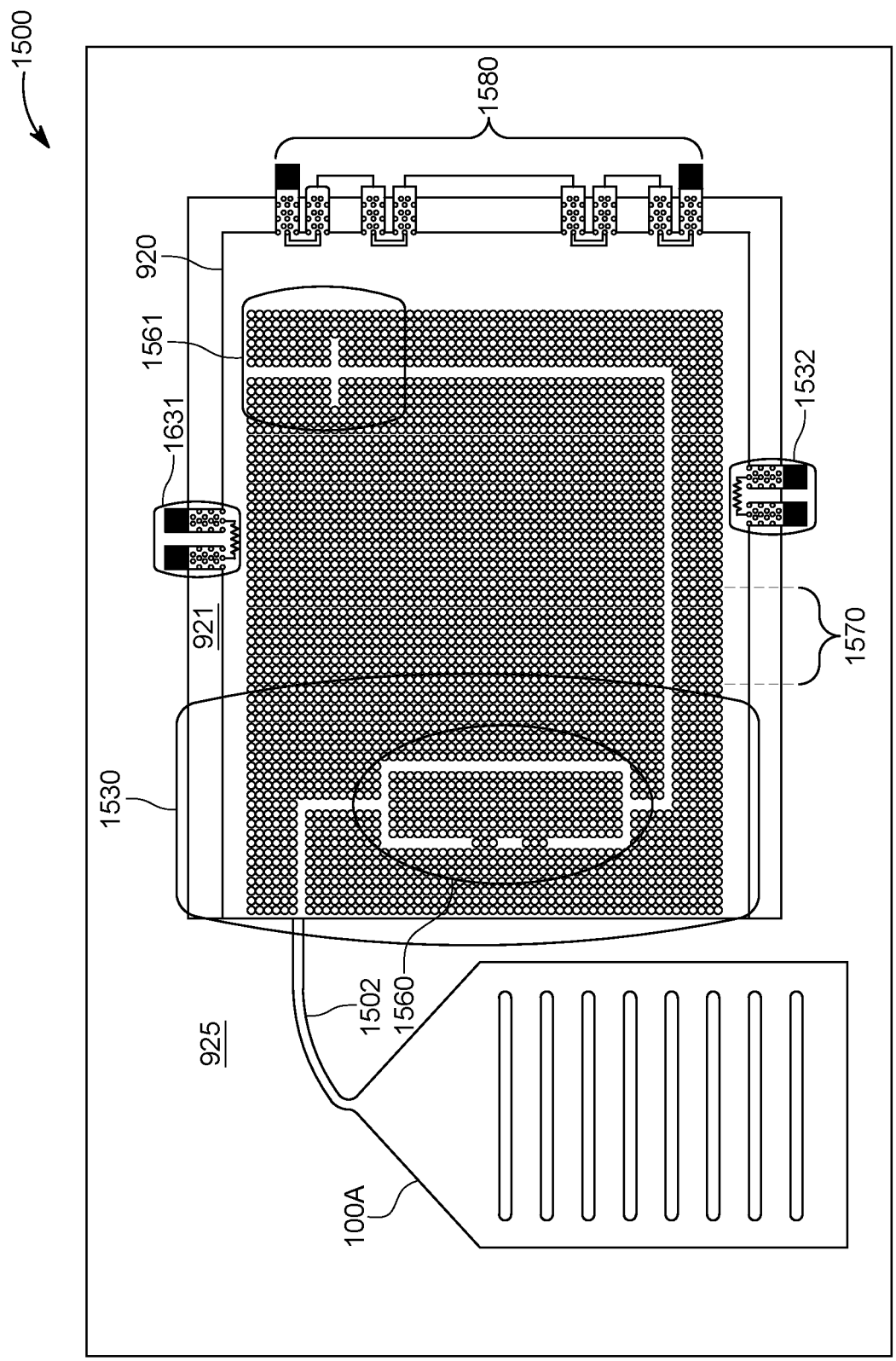

FIG. 15 is a plan view depicting an integrated thermal sensor chip structured as an embodiment of FIG. 14A wherein the PCWS comprises a Mach-Zehnder interferometer in accordance with the embodiments of the invention.

Figure 16:
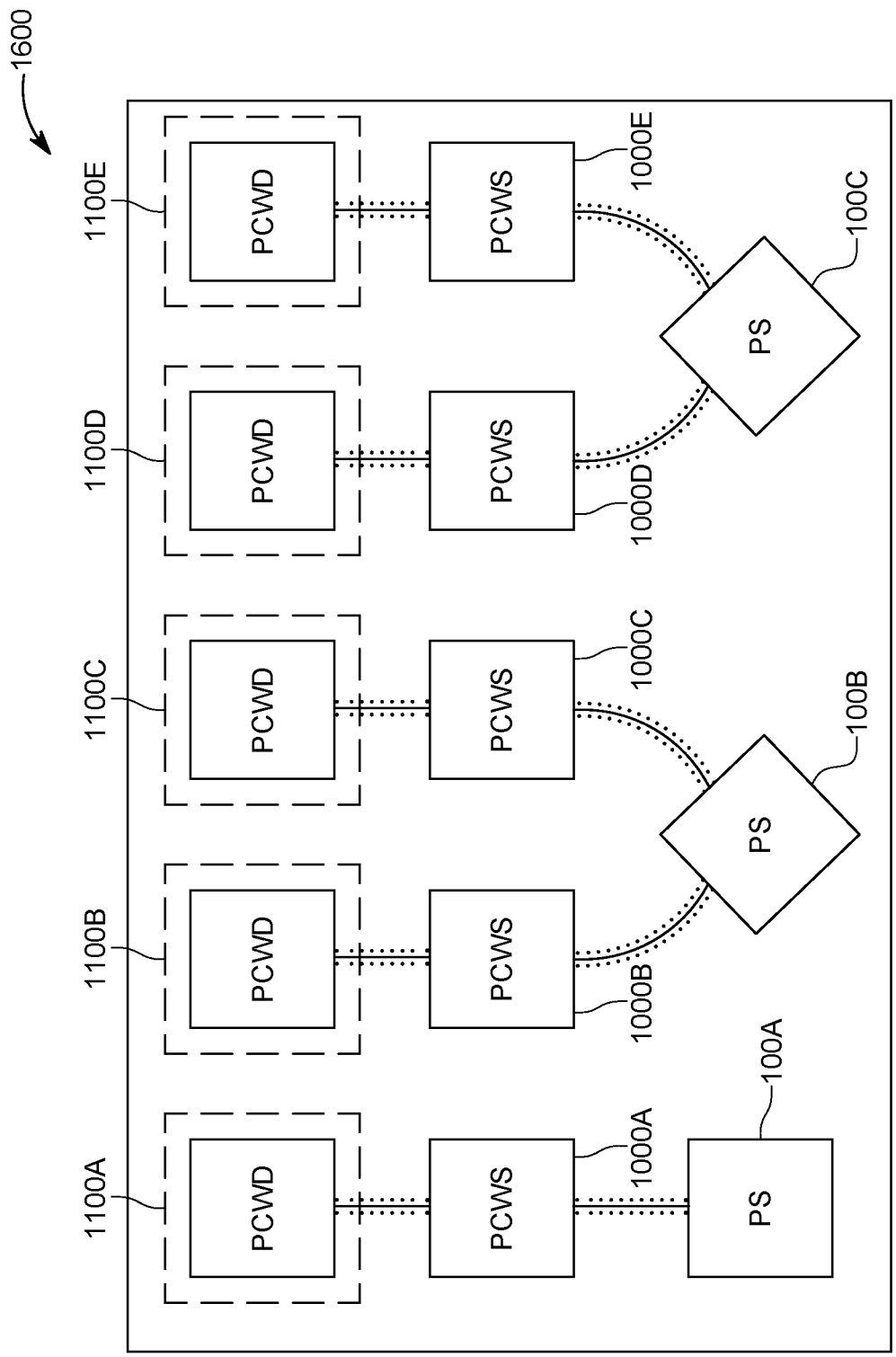

FIG. 16 is a schematic depicting an integrated thermal sensor chip comprising three photonic sources (PS), five photonic crystal waveguide sensor (PCWS) elements and five photonic crystal waveguide detector (PCWD) elements in accordance with embodiments of the invention.

Figure 17:
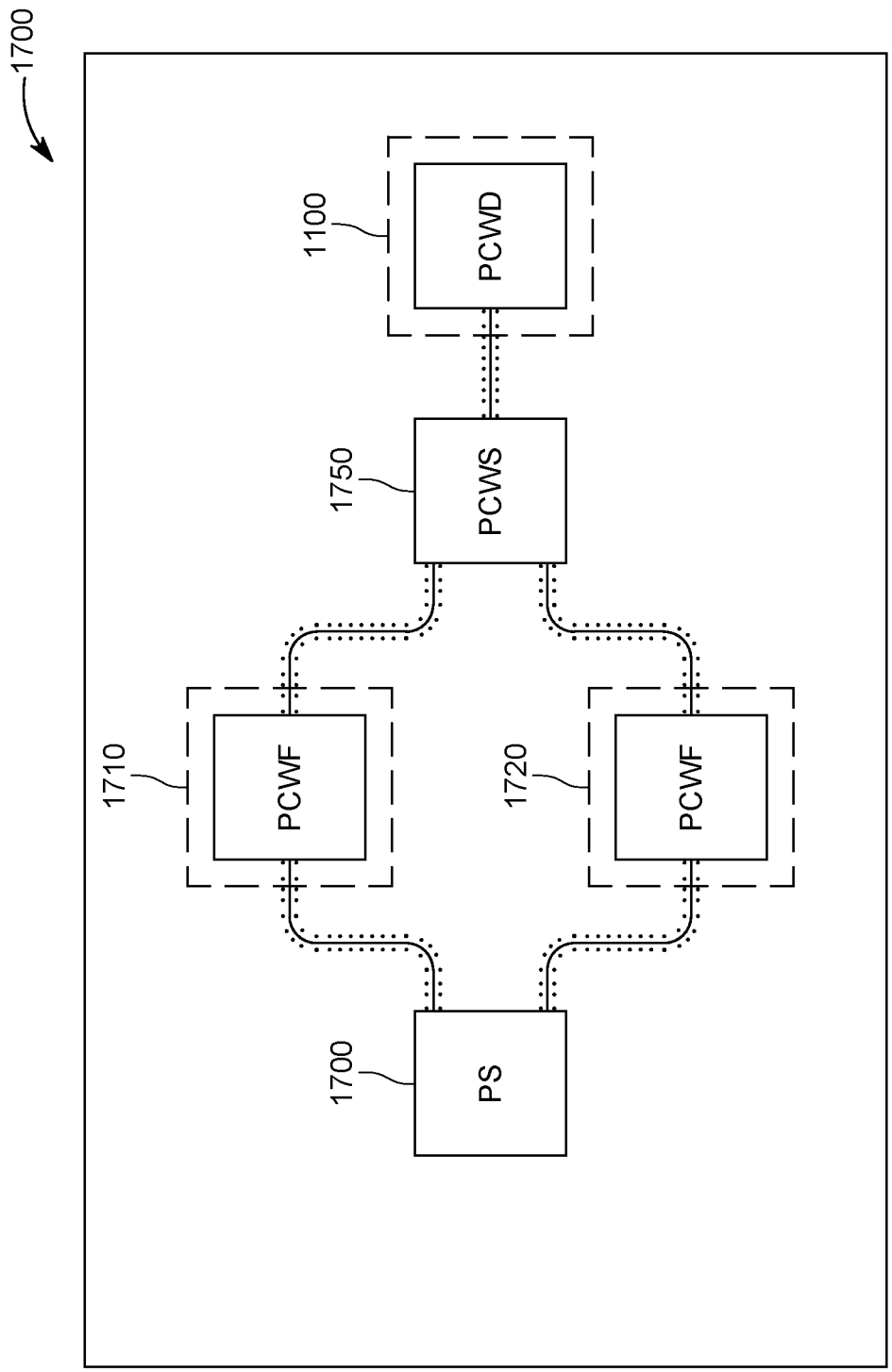

FIG. 17 is a schematic depicting an integrated thermal sensor chips comprising a photonic source PS, dual photonic crystal waveguide filters (PCWF), a photonic crystal waveguide sensor (PCWS) and a photonic crystal waveguide detector (PCWD) in accordance with embodiments of the invention.

Figure 18:
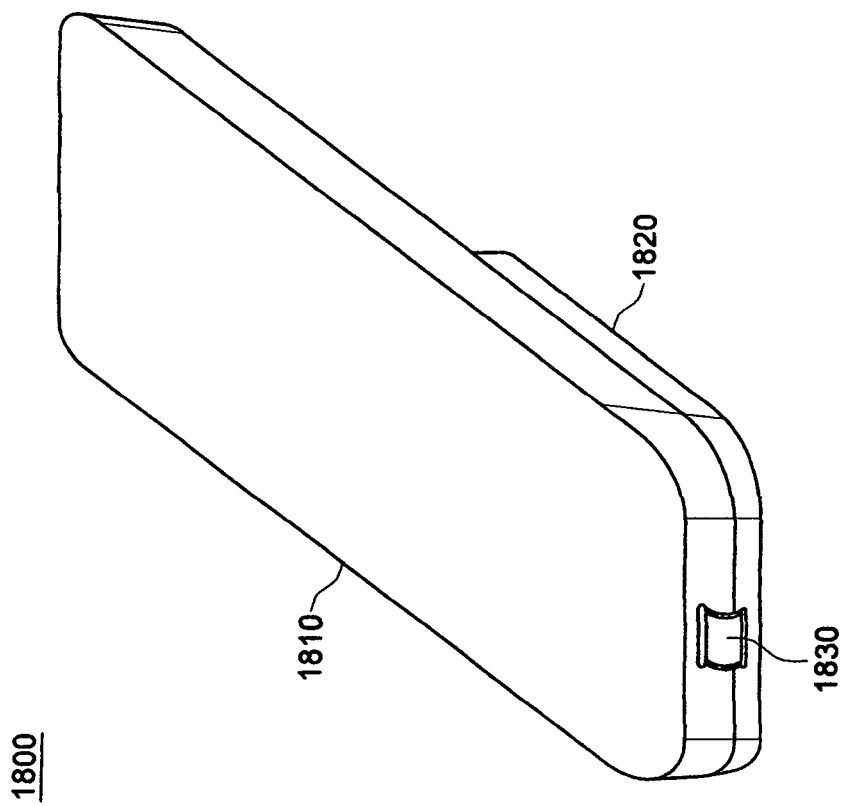

FIG. 18 depicts an integrated thermal sensor disposed on the backside of a mobile telephone in accordance with embodiments of the invention.

Figure 19A:
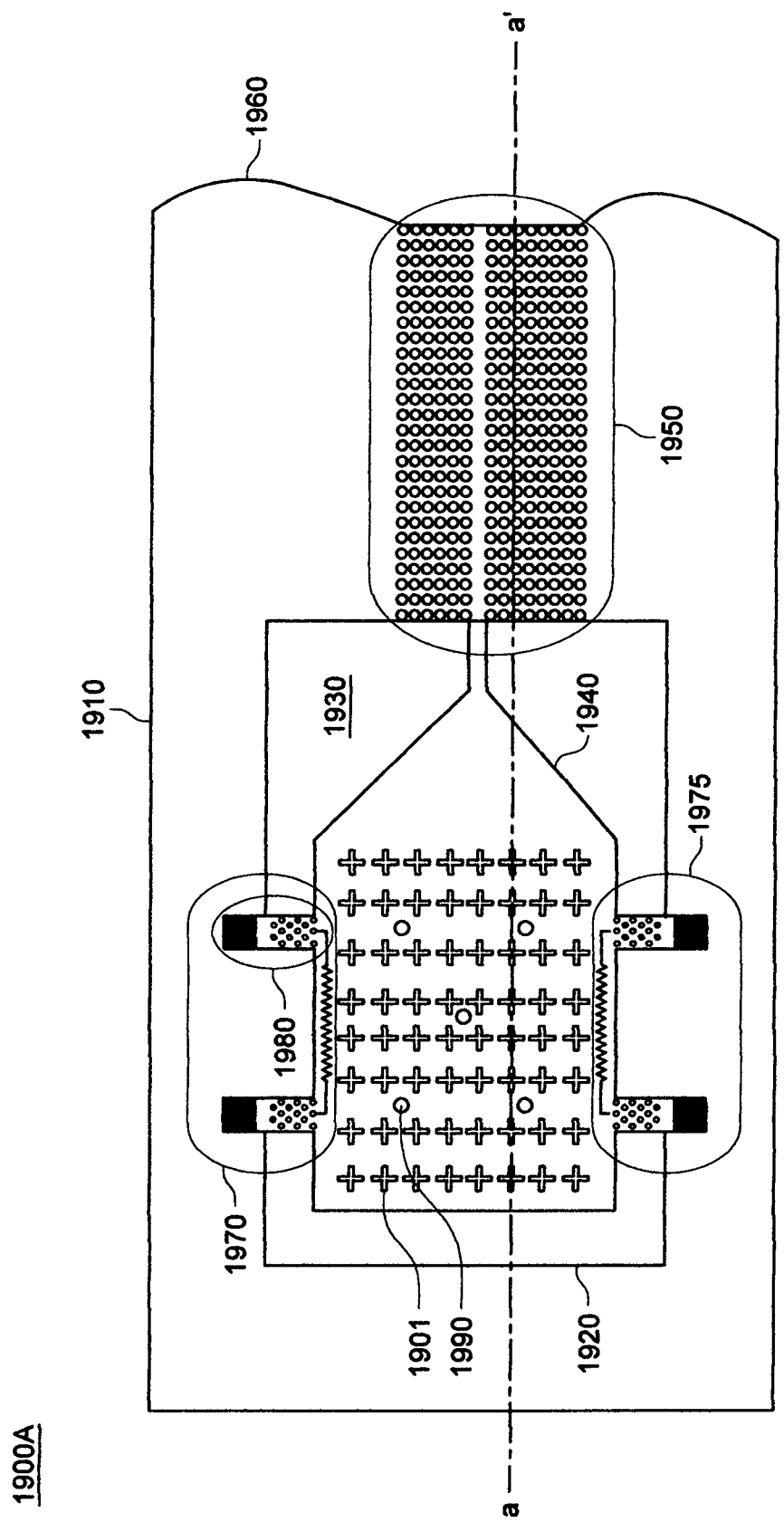

FIG. 19A depicts a plan view of a metamaterial-type photonic source (PS) comprised of a light emitting platform (LEP) providing the photonic carrier signal source in accordance with embodiments of the invention.

Figure 19B:
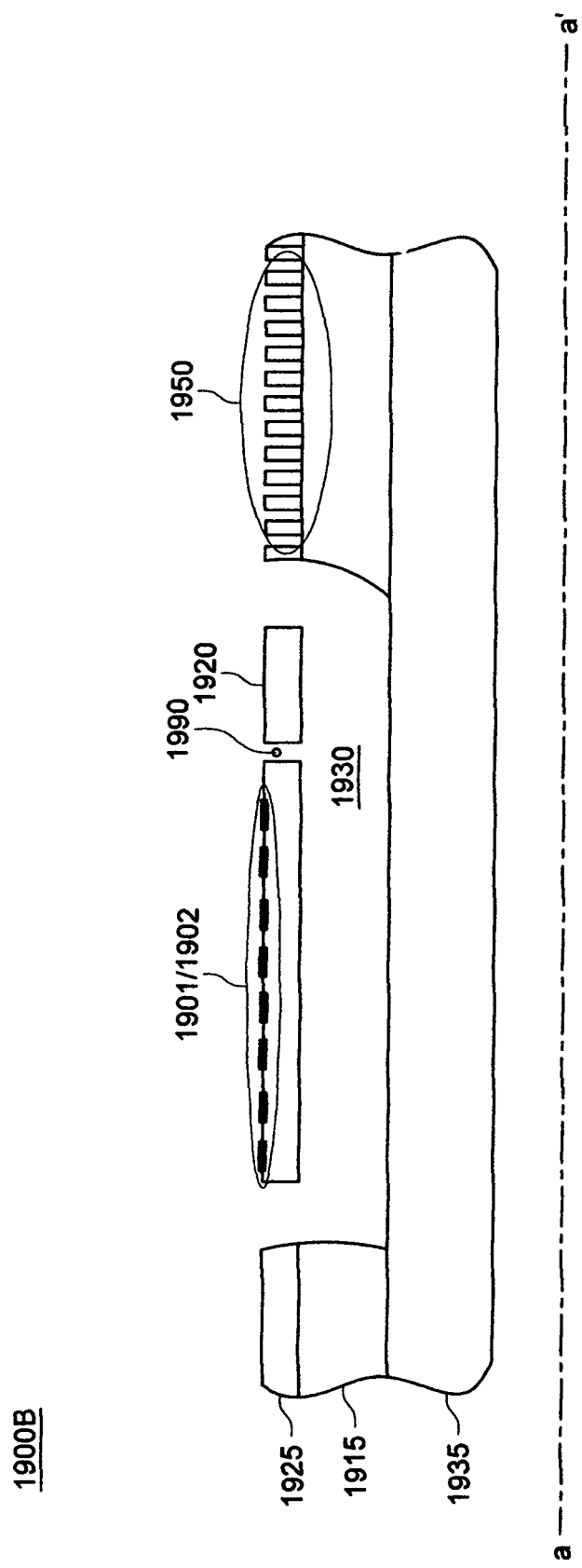

FIG. 19B depicts a cross-sectional view of the metamaterial-type photonic source (PS) of FIG. 19A.

DETAILED DESCRIPTION

Definitions: The following terms are explicitly defined for use in this disclosure and the appended claims:

"photonic" means electromagnetic energy having wavelengths ranging from visible to millimeters.

"analyte" means a gas, vapor, particulates affecting the photonic carrier signal detected from a photonic crystal waveguide sensor (PCWS) for the purpose of identification, monitoring or calibration.

"photonic element" or "photonic structure" means a structure providing variously a source, interface, coupling, focusing, guiding, switching, termination and sensing for a photonic carrier signal.

"phononic structure" means a structure for sourcing, interfacing, coupling, scattering, and resonating thermal phonons.

"light emitting platform" or "LEP" means a photonic element comprising a thermal micro-platform heated to a temperature providing a photonic source (PS).

"thermoelectric device" means a device for converting a temperature differential into an electrical signal or visa versa.

"photonic waveguide" or "PW" means a conventional photonic waveguide for guiding the photonic signal through a core pathway at least partially surrounded by cladding of a lower effective index of refraction.

"photonic crystal waveguide" or "PCW" means a metamaterial photonic element guiding a photonic wave through a core pathway at least partially surrounded by a cladding structure comprising a photonic crystal.

"photonic crystal waveguide sensor" or "PCWS" means a photonic element comprised of a photonic crystal waveguide (PCW) structure wherein the structure is sensitive to changes in effective refractive index when photonically-coupled to an analyte.

"photonic crystal waveguide filter" or "PCWF" means a photonic element comprised of a photonic crystal waveguide (PCW) structured to modulate the amplitude, phase or channel bandwidth of the photonic carrier signal.

"photonic crystal waveguide detector or PCWD" means a photonic element comprised of a photonic crystal waveguide (PCW) with thermally-dispersive structure and a temperature sensing device.

"photonic zero-reflection termination" means the thermally-dispersive structure within a photonic crystal waveguide detector (PCWD) element providing a termination for the photonic carrier signal.

"spectrophotometer" means an instrument comprised of at least a PS, PCWS and PCWD wherein the magnitude or phase of a photonic carrier level is measured for the purpose of identifying or monitoring an analyte.

"SOI" means a wafer comprised of a semiconductor topside device layer, an intermediate oxide film, and an underlying handle substrate. In the case of silicon SOI, the three sandwich layers are a silicon device layer, silicon dioxide and silicon substrate.

Figure 1A:
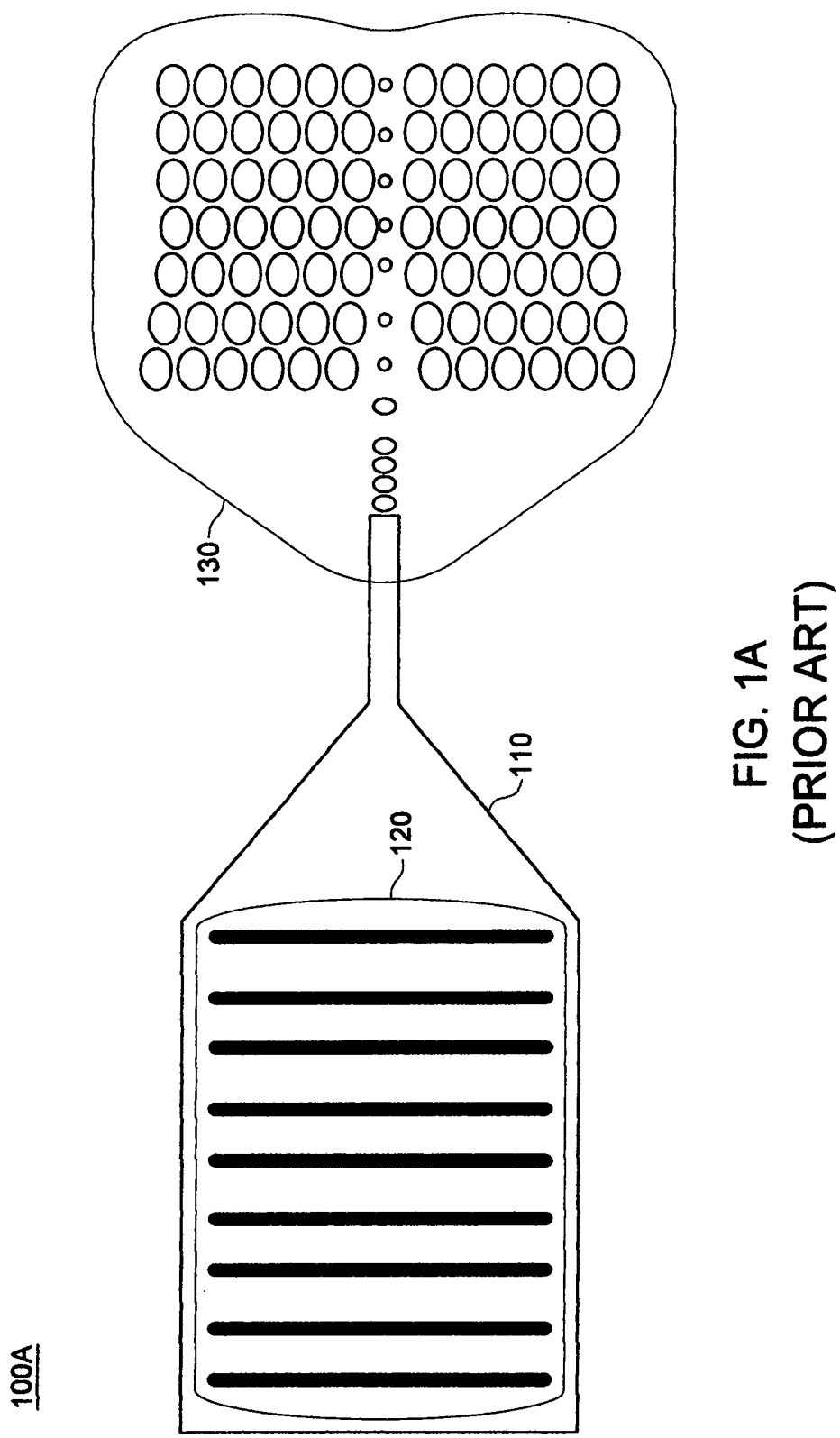
Figure 1B:
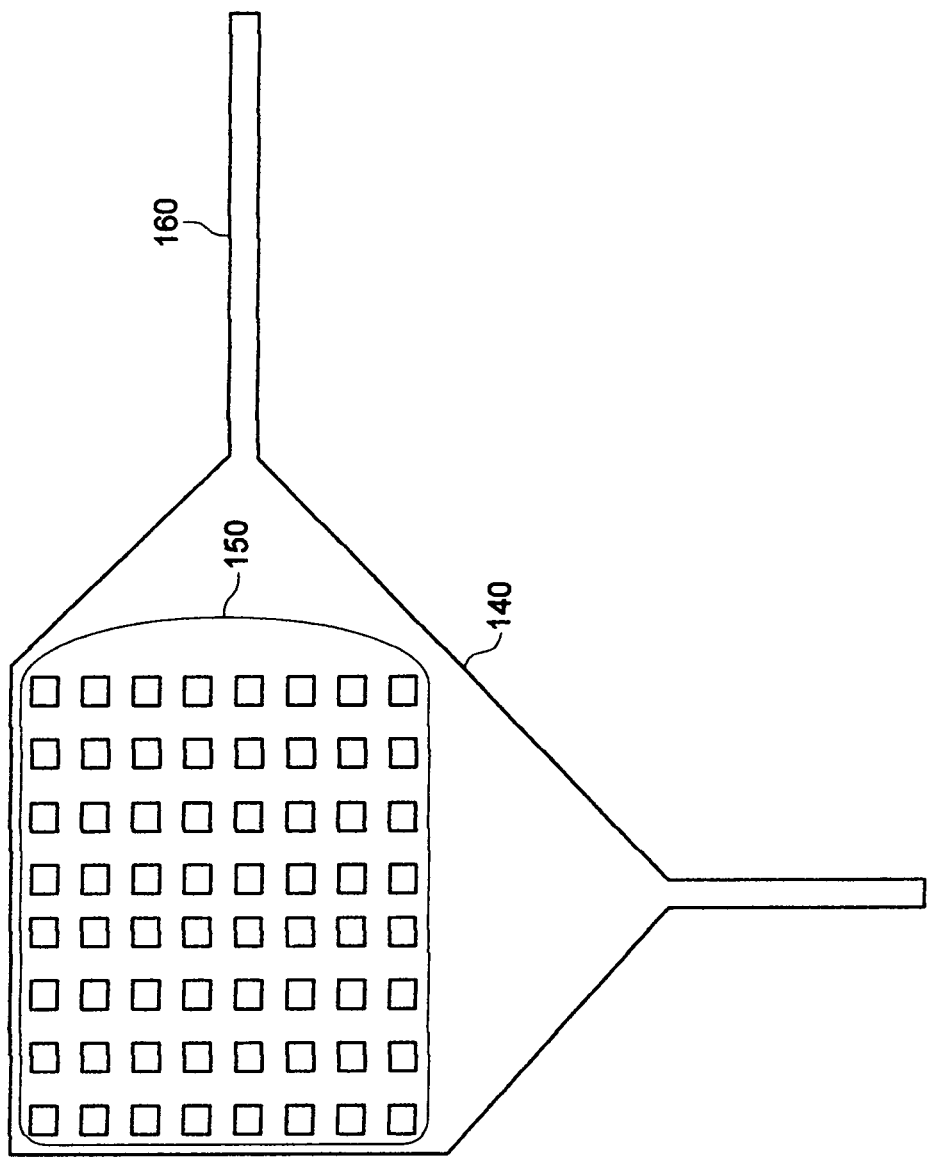
Figure 2A:
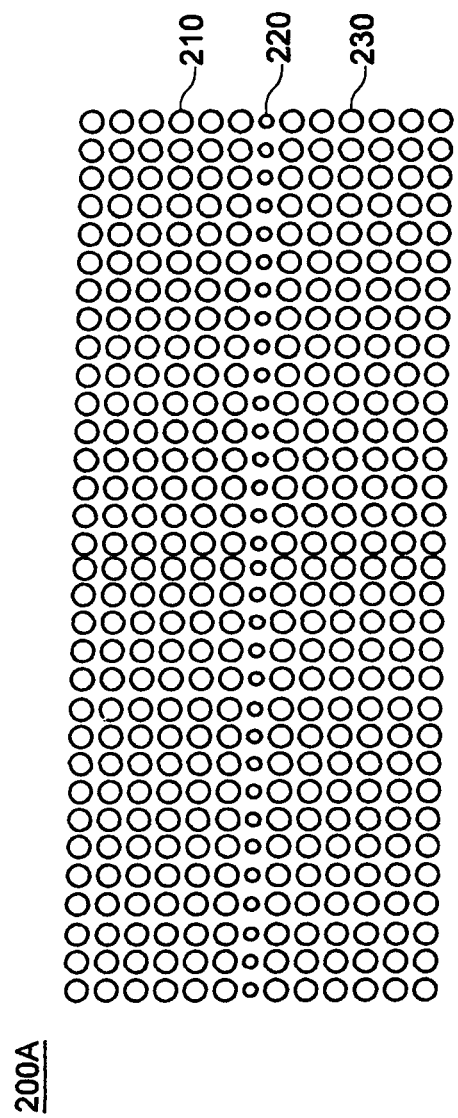
FIG. 2A depicts a plan view of a prior art photonic crystal waveguide (PCW) with a holey waveguide core providing a bandwidth filter or photonic interconnect.
Figure 2B:
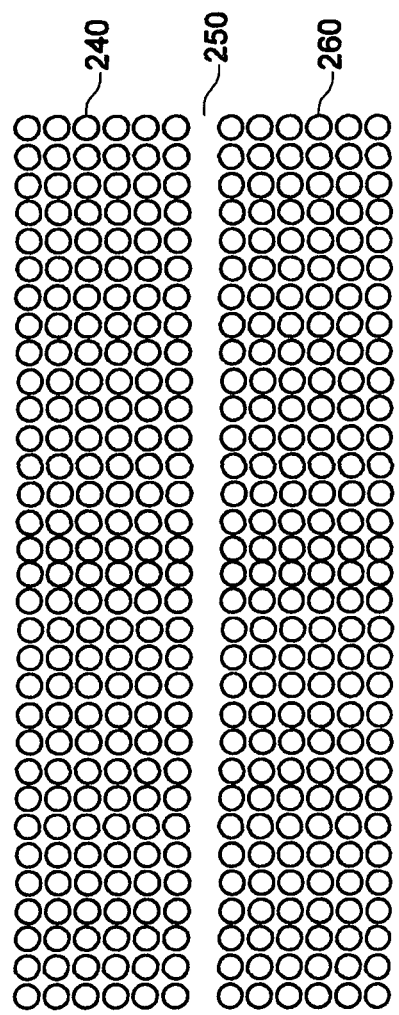
FIG. 2B depicts a plan view of a prior art photonic crystal waveguide (PCW) with a slab waveguide core providing a bandwidth filter or photonic interconnect.
Figure 3:
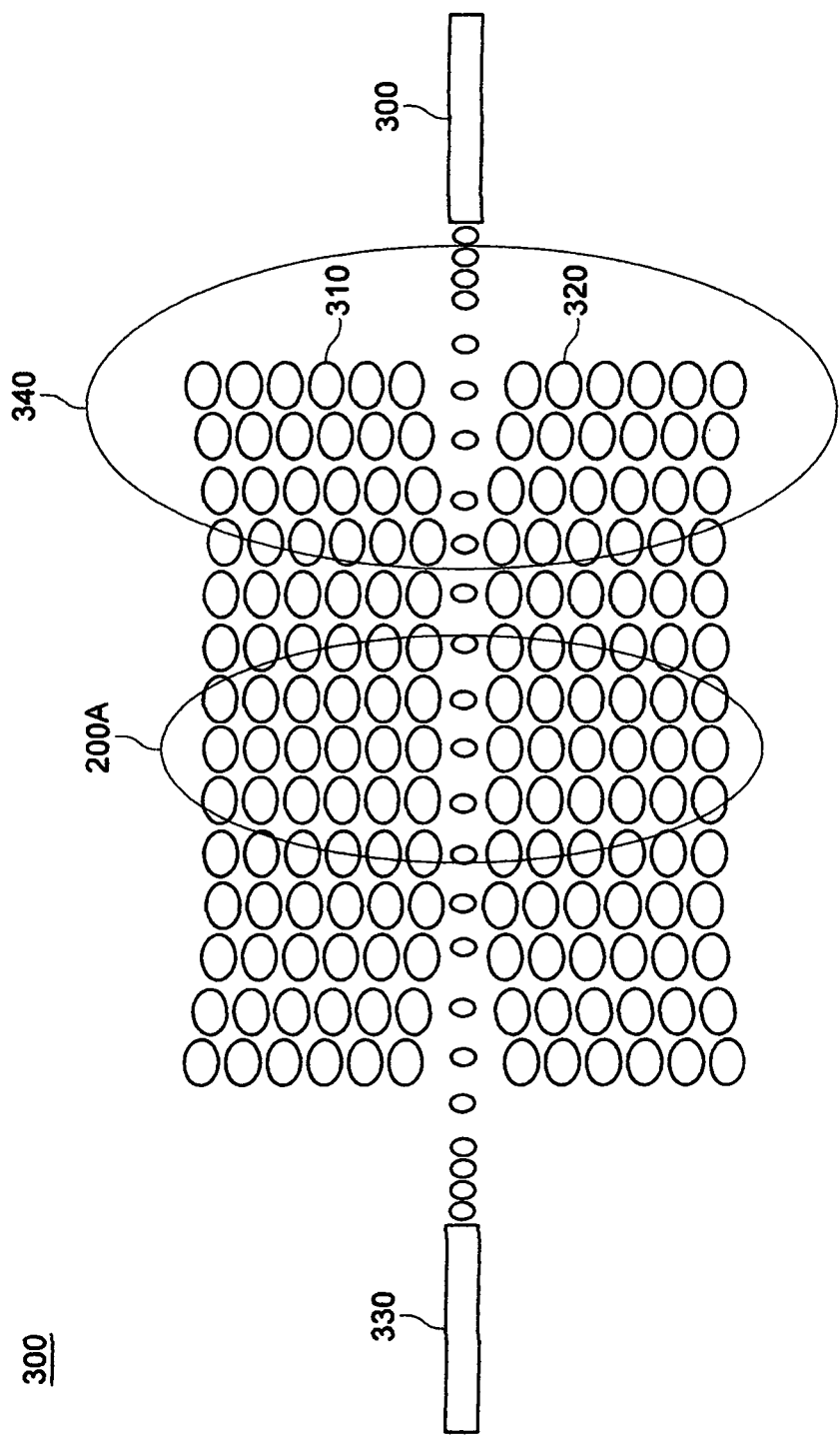
FIG. 3 depicts a plan view of a prior art photonic crystal waveguide (PCW) with a holey core interfaced to a slab waveguides at input and output.
Figure 4A:
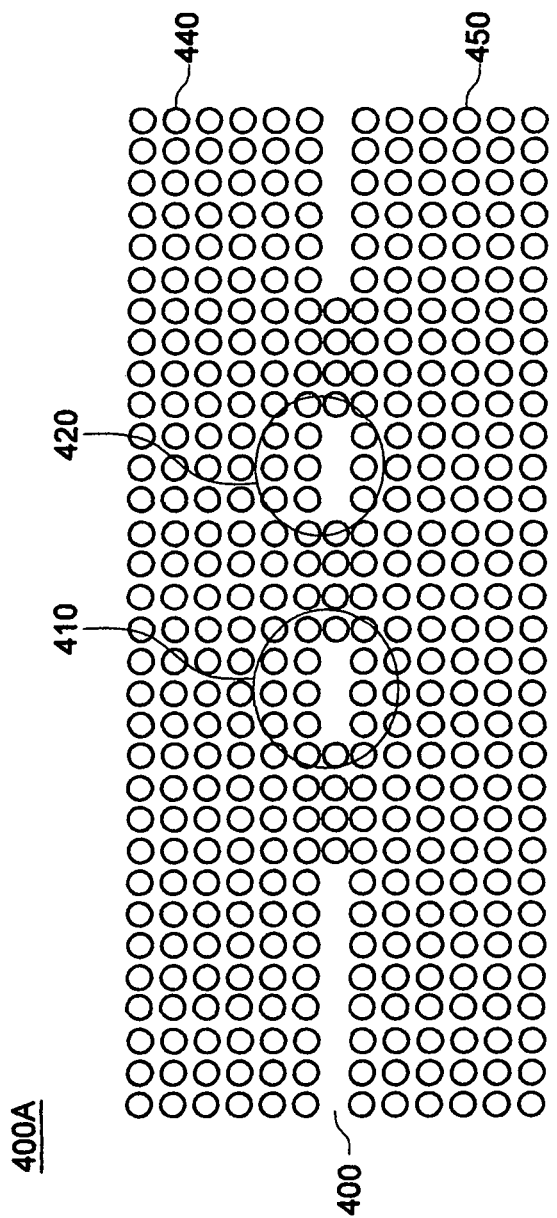
FIG. 4A depicts a plan view of a prior art photonic crystal waveguide sensor (PCWS) structured with two resonant high-Q sensor cavities within the slab core.
Figure 4B:
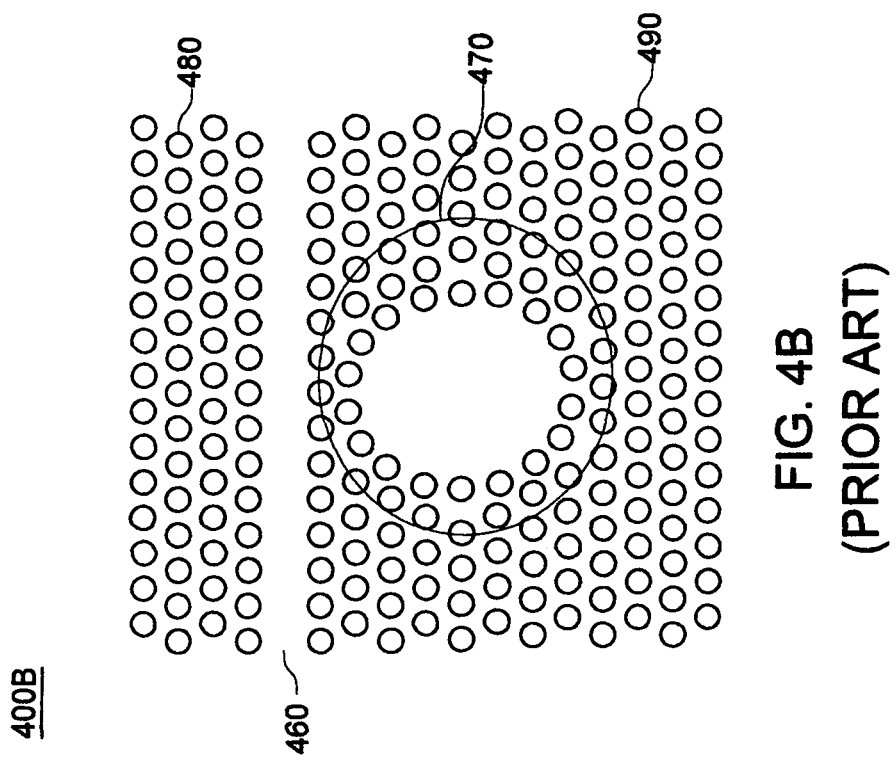
FIG. 4B depicts plan view of a prior art photonic crystal waveguide sensor (PVWS) structured with a resonant high-Q sensor cavity embedded into the cladding adjacent to the slab core.
Figure 4C:
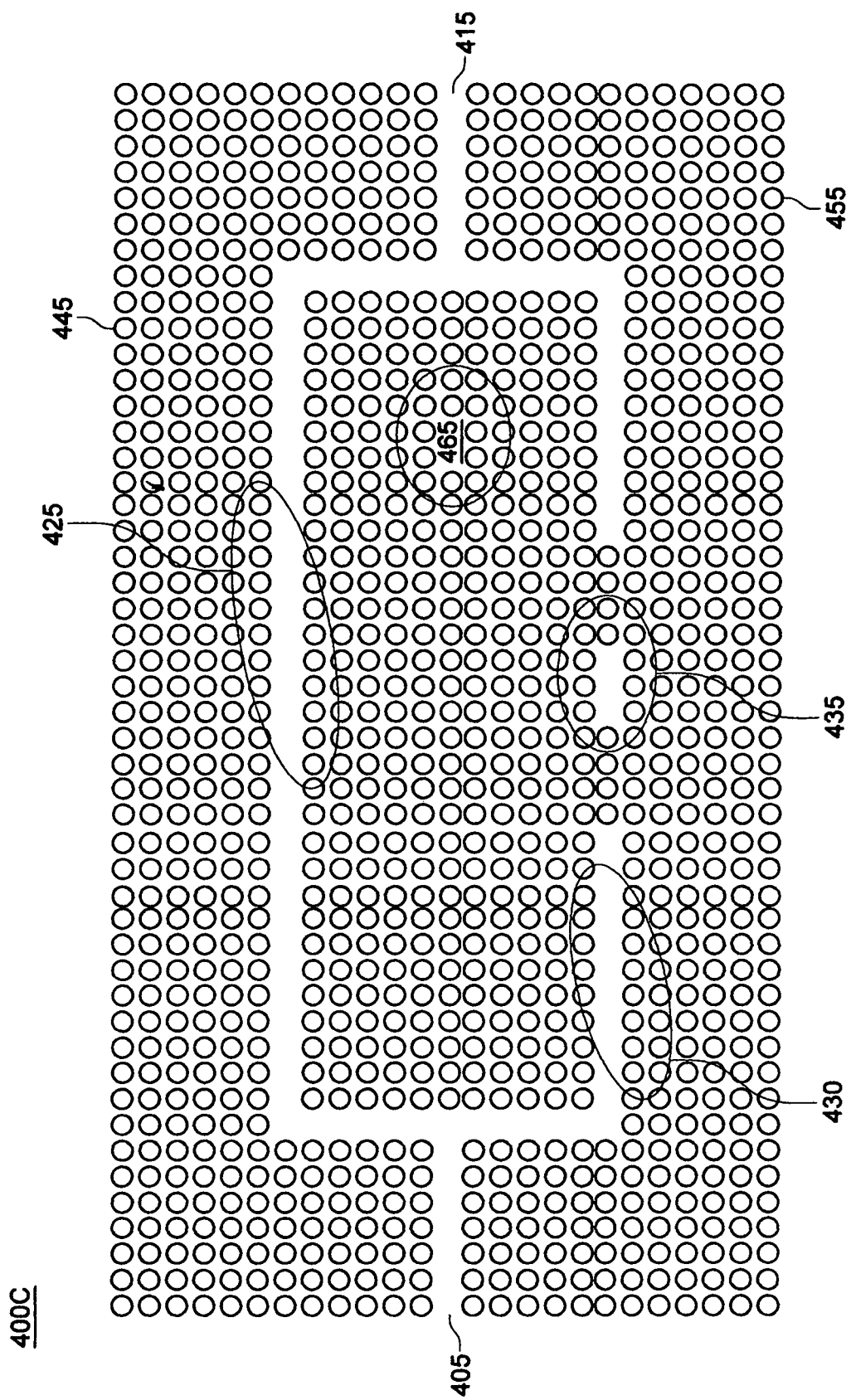
FIG. 4C depicts plan view of a prior art photonic crystal waveguide sensor (PCWS) structured with a Mach-Zehnder interferometer having an internal high-Q resonant sensor cavity.
Figure 5:
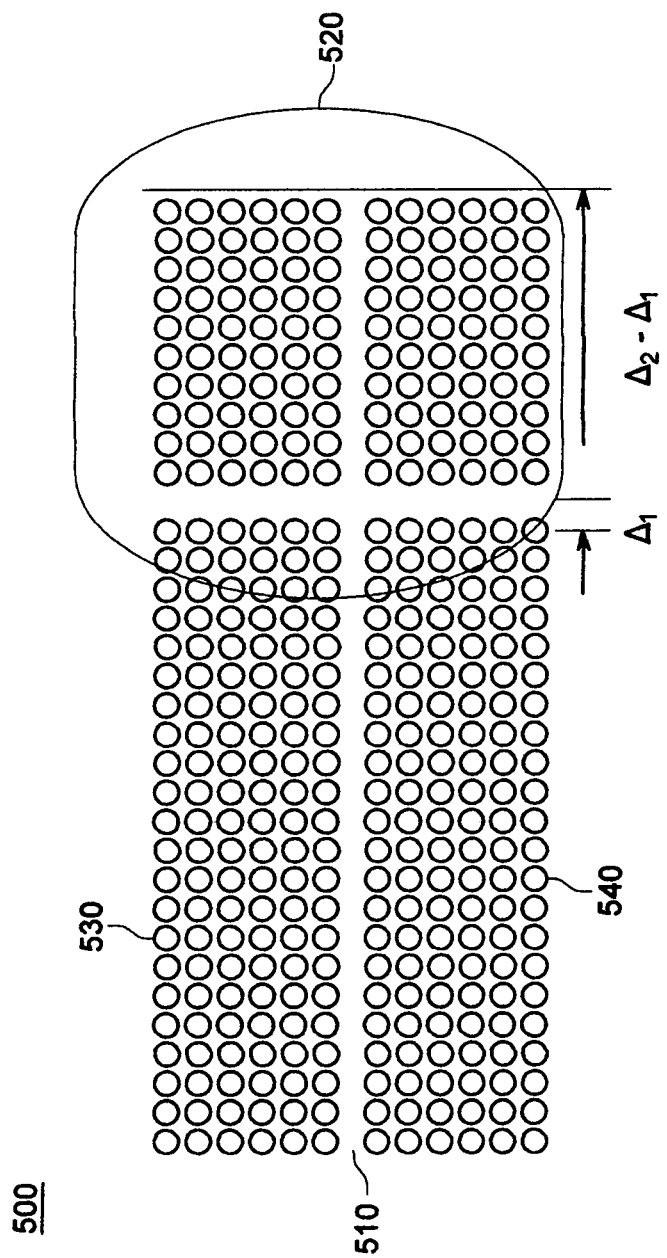
FIG. 5 depicts a plan view of a prior art photonic crystal waveguide (PCW) with a nonreflecting photonic crystal termination for the photonic carrier signal.
Figure 6:
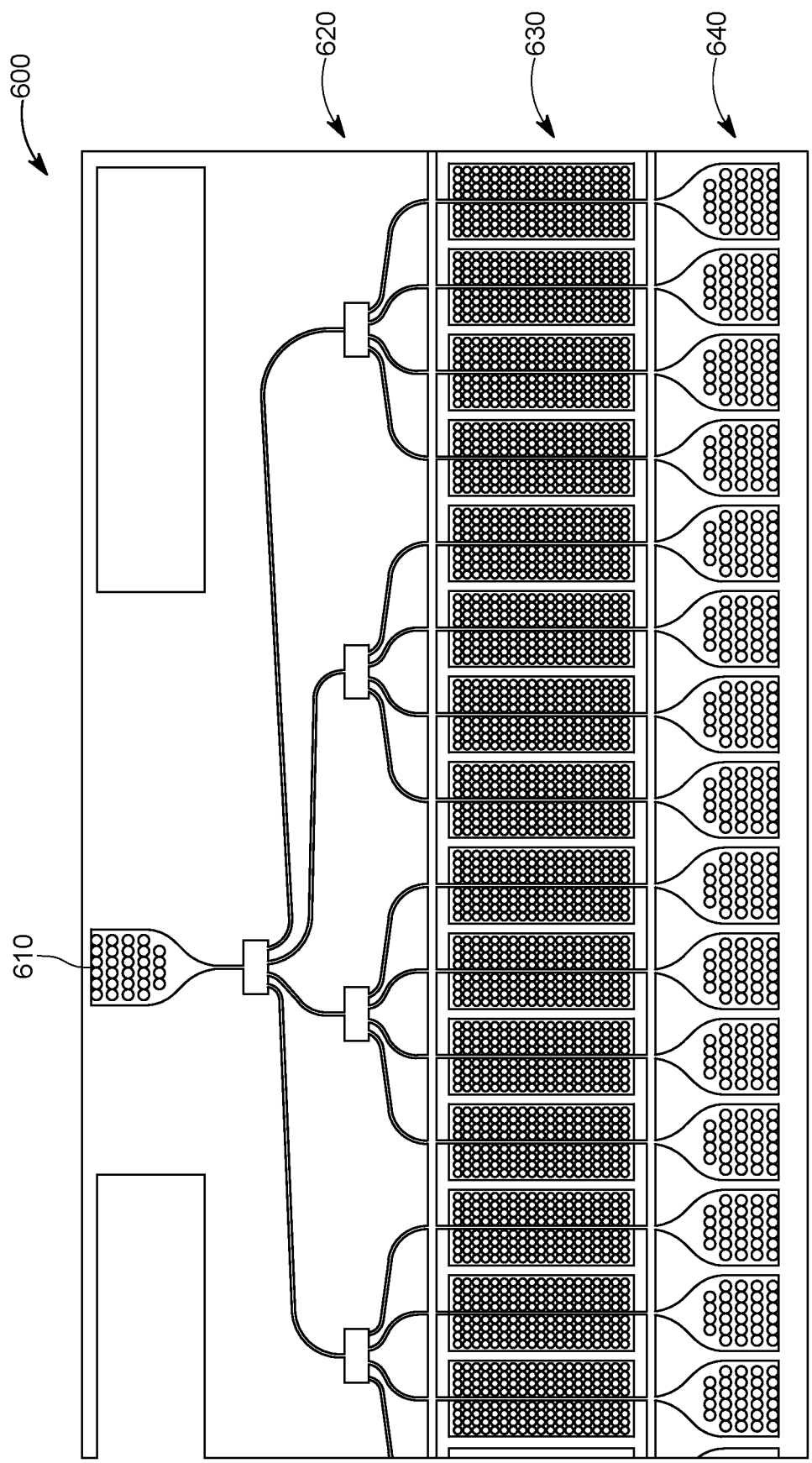
FIG. 6 depicts a plan view of a prior art photonic chip structured with a photonic crystal waveguide sensor and with photonic input and output couplers.
Figure 7:
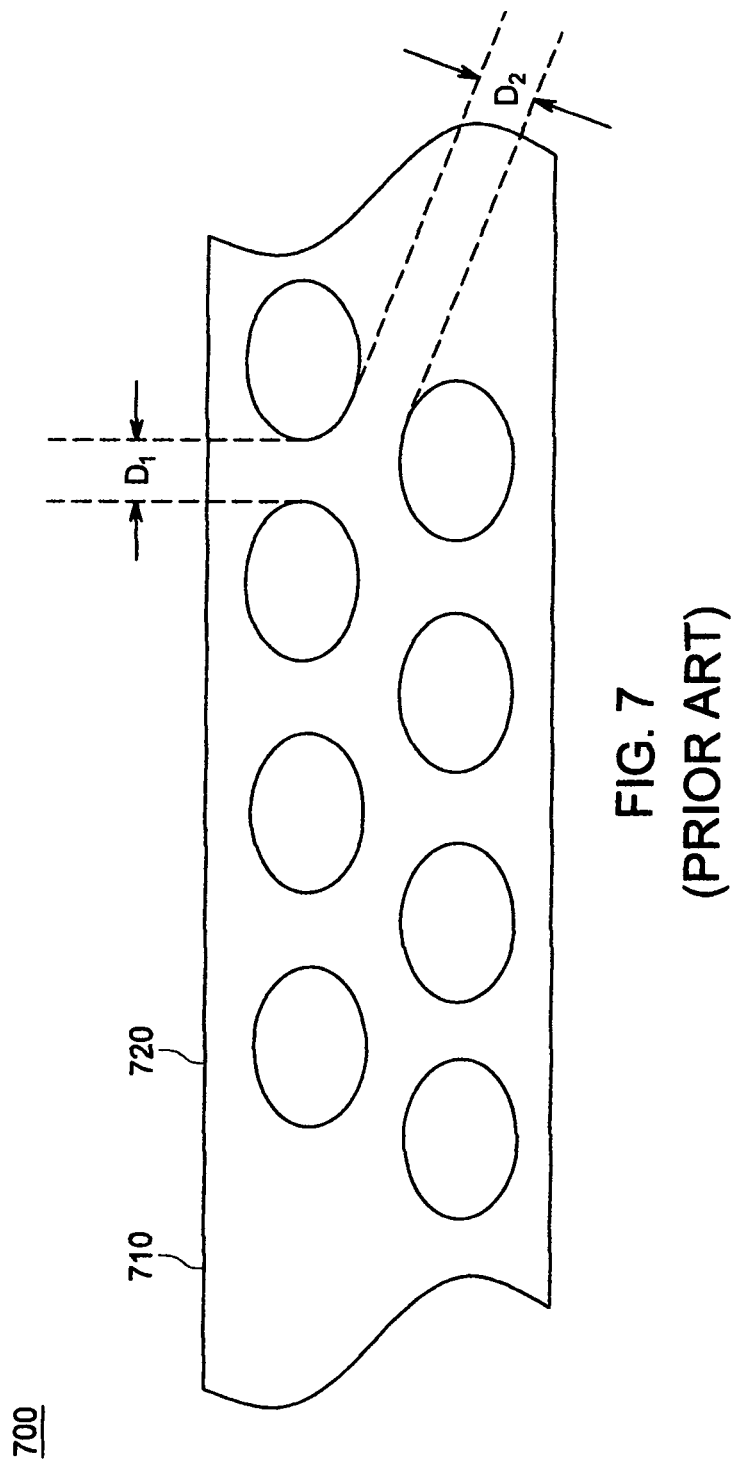
FIG. 7 depicts plan view of a prior art nanowire with phononic scattering structures.
Figure 8:
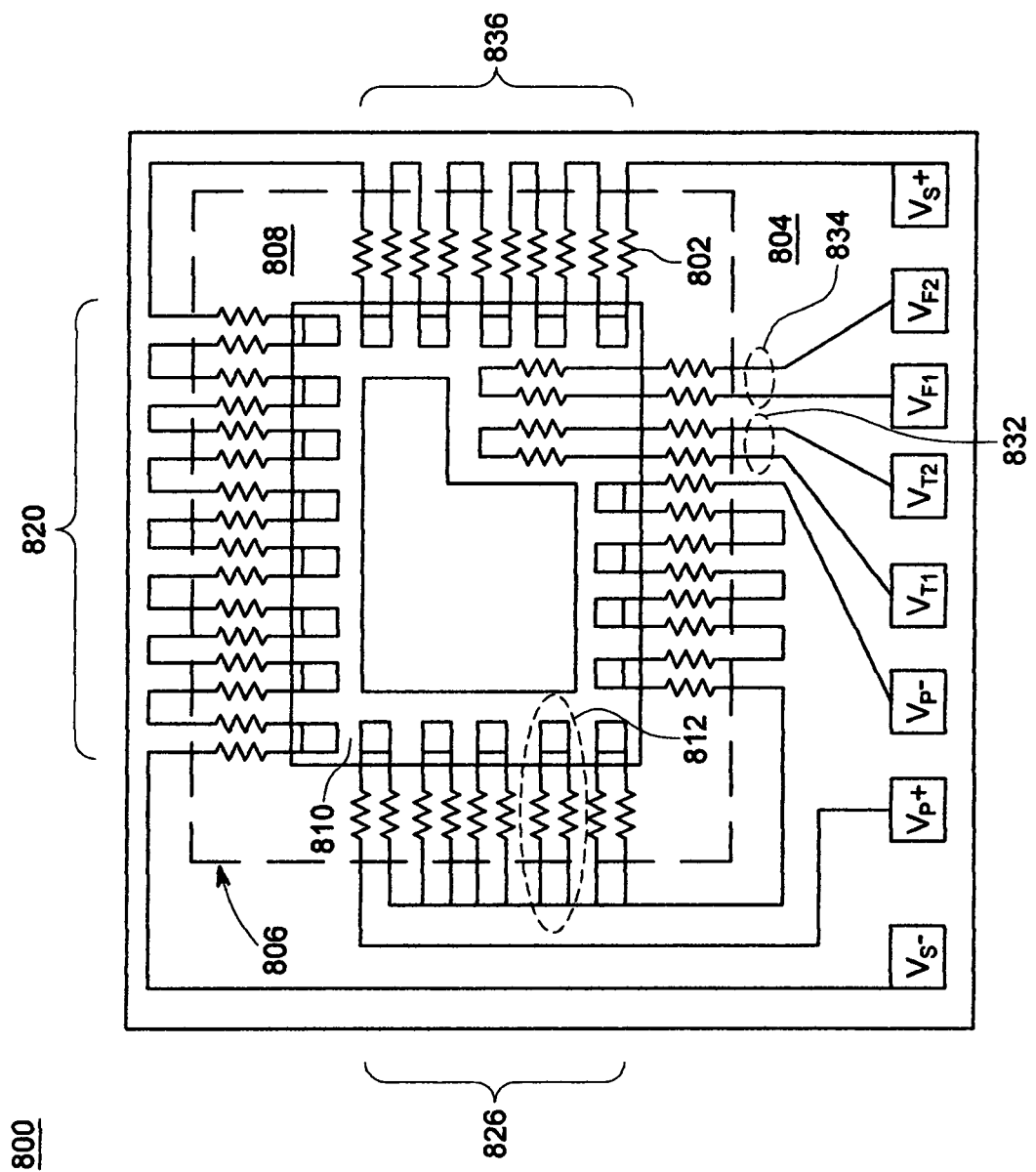
FIG. 8 depicts a plan view of a prior art thermally-isolated micro-platform supported by nanowires with phononic scattering structures.
Figure 9A:
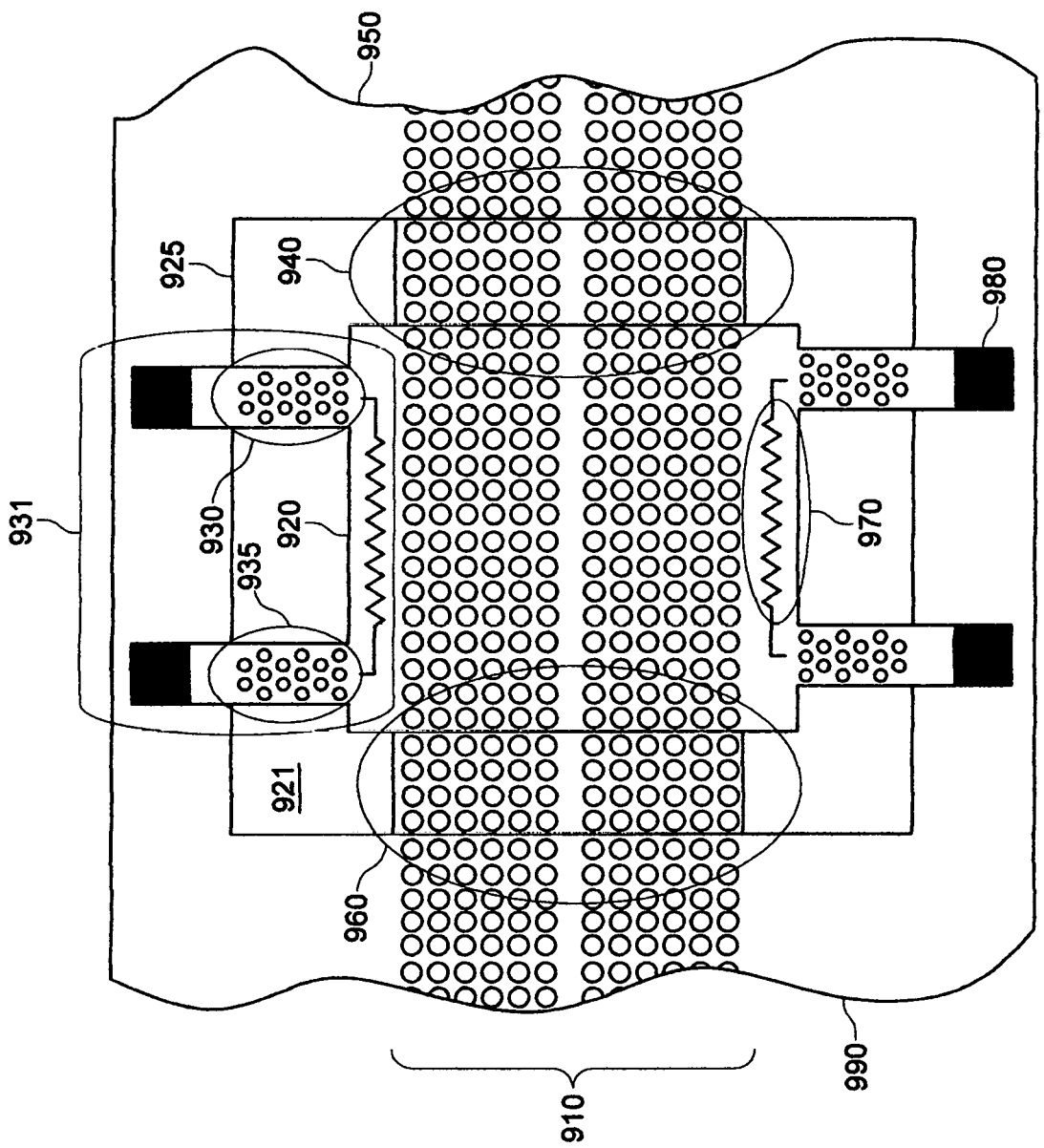
FIG. 9A depicts a plan view of a photonic crystal waveguide filter (PCWF) element comprised of integrated IP & P structures having temperature control.

FIG. 9A depicts a photonic element PCWF 900A comprising a thermally isolated micro-platform 920 supported with nanowires 930, 935, 940 and 960 wherein electrical contacts are depicted with bonding pads 980. A photonic carrier signal entering surface 990 propagates through a coupling PCW into a first nanowire 960 comprising a PCW within the PCWF. The photonic carrier signal continues through the PCWF and PCWF nanowire 940 into a second PCW. This photonic carrier signal continues through a second PCW and out through surface 950 into the next photonic element within the cascade of elements.

In the embodiment of FIG. 9A, the temperature of the micro-platform is controlled at the platform level with resistive heater thermal element 970 disposed on thermal micro-platform 920. The thermal device depicted by nanowires 930, 935 comprises one or more of a Seebeck thermoelectric sensor, pyroelectric sensor, thermistor sensor, or Peltier cooler.

In applications, the PCWF modulates the signal carrier level, phase or wavelength passband by temperature control of the micro-platform 920. In embodiments, the PCWF filter provides a signal of reduced bandwidth and in embodiments the PCWF selects a photonic wavelength channel. In some applications, this pixel provides a modulator or switch for photonic signals in the 1150 nm wavelength range.

Figure 9B:
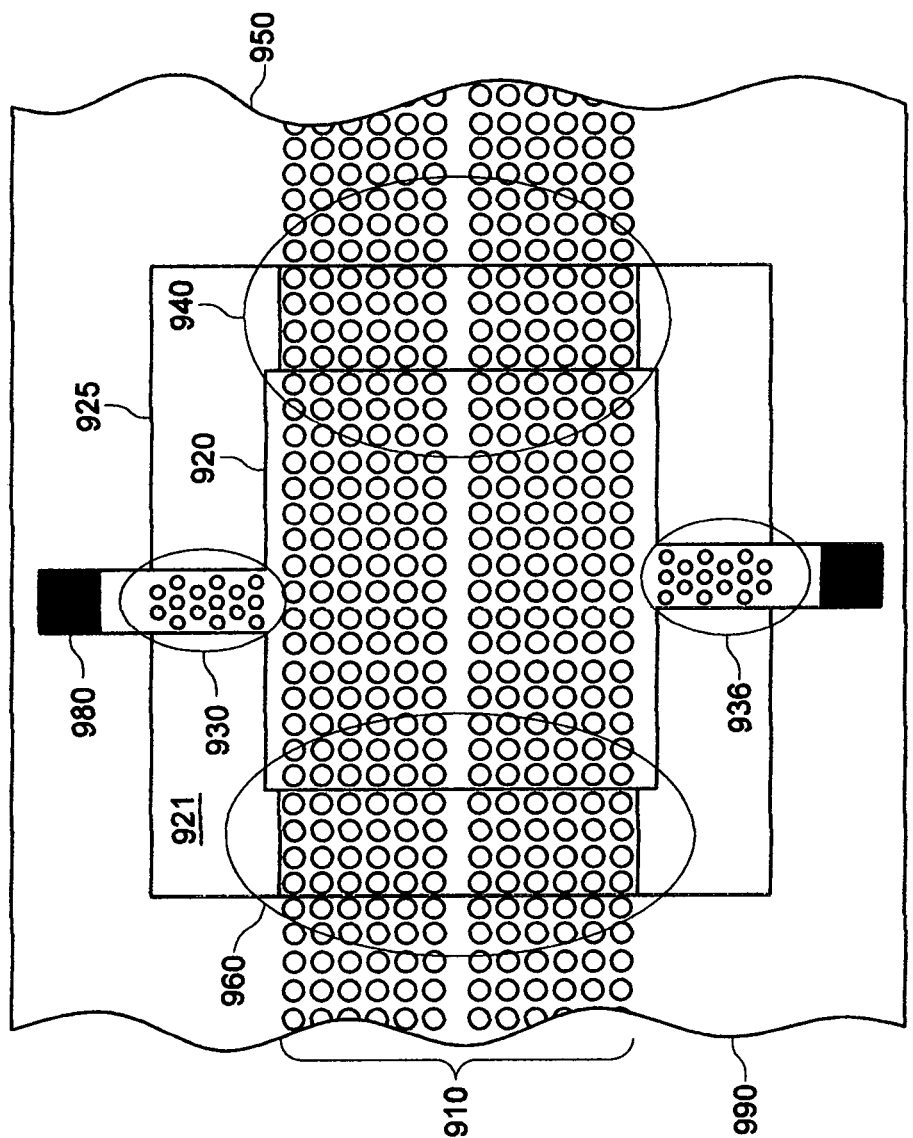
FIG. 9B depicts plan view of a second photonic crystal filter (PCWF) embodiment without external temperature control in accordance with embodiments of the invention.

FIG. 9B depicts a PCWF without a dedicated temperature sensing device. In this embodiment, the input photonic carrier signal from PCW 910 into PCW 960 continues into the PCWF 920. The is modulated by the photonic passband of the PCW within the PCWF micro-platform 920. In this depiction, nanowires 930, 936 provide support for the micro-platform 920 suspended over cavity 921. Structures 960 and 940 are IP & P structures providing input and exit photonic links in addition to thermal isolation of the micro-platform. The micro-platform is powered by an electric power supply connected into contact pads 936 and 980. In one application, a plurality of the PCWF provides a multiplexing switch for photonic signals. The PCW within a filter PWCF in embodiments may be structured to provide slow-wave operation providing a phase delay for the photonic signal. In some embodiments, the PCWF is not configured as a thermal micro-platform and is operated at ambient temperature.

Figure 10A:
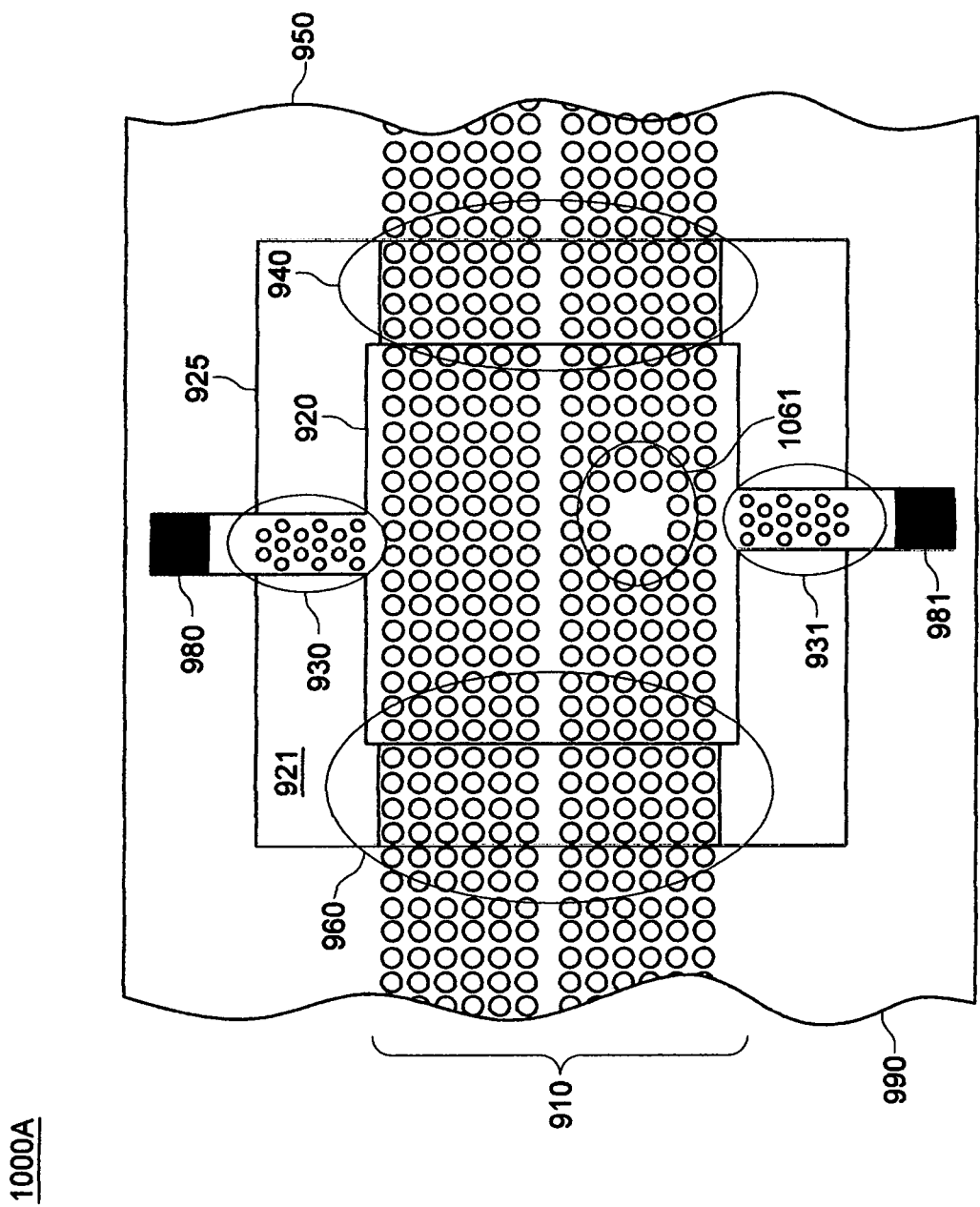
Figure 10B:
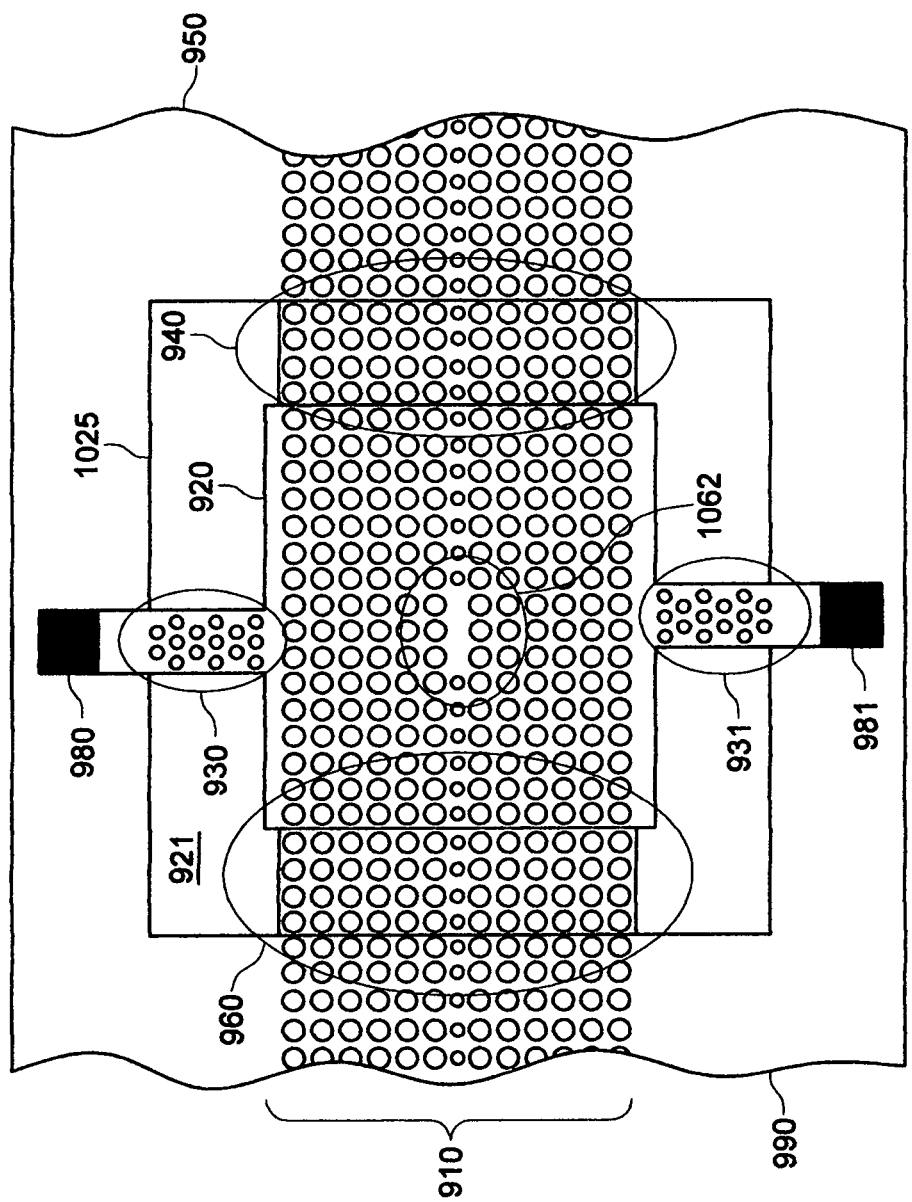

FIGS. 10A, 10B and 10C depict example embodiments of photonic crystal waveguide sensor PCWS elements. A photonic carrier signal enters the PCWS through PCW 910 into port 990, proceeds through nanowire 960, on into the PCW sensing area of micro-platform 920 having a high-Q sensor structure 1061 within the PCW cladding, continues on through a second nanowire 940 and exits into the PCW at exit port 950. The nanowires 960 and 940 comprise PCW structures comprise IP & P structure providing a photonic guide and phononic isolation for the thermal micro-platform 920. The micro-platform 920 and nanowires 960, 940 are disposed over cavity 921. The thermal micro-platform 920 in this embodiment is heated through a resistive heater comprising the active layer of the micro-platform and nanowires 930, 931 with off-platform bonding pad connections 980, 981.

An external electrical power source connected into bonding pads 980, 982 provides current for heating the micro-platform 920. The resistor formed of the series connection of nanowires 930, 931 and the micro-platform 920 in addition provides a thermistor for monitoring the platform temperature.

In the embodiments of FIGS. 10A, 10B and 10C, a PCWS comprising thermal micro-platform 920, nanowires 930, 931, 940, 960 is connected to interposer PCWs at an entrance port 910 and an exit port at 950. The PCWS is structured with PCW wherein the photonic carrier signal propagates as a slow-wave mode. The slow-wave mode can provide a maximum sensitivity with exposure to an analyte of interest. The periodic holes in the cladding structure of the PCW structure creates a negative index dispersion at the spectral bands of interest to reduce the group velocity for the photonic carrier signal propagating through a core of the PCW. In the illustrated PCWS embodiments of the FIGS. 10A, 10B and 10C, the group velocity of the propagating wave through the core is significantly reduced with respect to free space propagation. In embodiments of this invention, the guided wave core may be of slab, holey or slot-type.

The sensor PCWS 1000A depicted in FIG. 10A comprises a single high-Q resonator 1061 imbedded in the cladding area within the PCW of sensor micro-platform 920. Resonator 1061 is electromagnetically coupled to the evanescent tail of the slow-wave propagating through the PCW of the micro-platform 920. Quality factors of 10,000 and higher are achievable with these resonant structures. The resonator provides a high sensitivity to nearby minute changes in refractive index when exposed to an analyte of interest.

The PCWS 1000B of FIG. 10B comprises a single high-Q resonator 1062 disposed in the PCW core and electromagnetically coupled to the slow-wave propagating through the core. In this illustrative embodiment, the core guide is of holey type wherein the resonator 1062 can be considered as a "defect" within the PCW core. In this embodiment the optical carrier signal propagates from the PCW 910 entrance port through to PCW exit port 950 similar to the PCWS of FIG. 10A. The "defect" 1062 in the PCW core is sensitive to an exposed analyte as in FIG. 10A. Provision is made for heating of the sensor micro-platform using an electrical power source connected at pads 980, 981.

Another PCWS 1000C embodiment is depicted in FIG. 10C wherein the PCWS comprises nanowires 930, 931, 960, 1040 supporting thermal micro-platform having an area 1063 sensitive to an exposed analyte. This localized incremental shift in the physical separation and diameter of holes 1063 within the PCW creates a dispersion in the PCW impedance which is sensitive to an exposed analyte. In regions of the PCW 960, 1040 a varying separation between core holes provides a desirable impedance match transition to the PC 910 disposed external to the PCWS.

In the embodiments of FIGS. 10A, 10B and 10C, the thermal heater within the PCWS is used to outgas an analyte remaining on or in the PCWS following a spectrographic measurement. In an exemplary embodiment with a silicon-based thermal micro-platform, the platform is heated to temperatures as high as above 500 degrees C. for the outgassing procedure.

In other embodiments, additional mechanical structures are provided to transport and increase exposure of an analyte to the PCWS. For example, a vaporizer disposed proximal can be used to direct a vapor form of the analyte onto the PCWS. In other embodiments, a robotic cantilever moves microscale analyte samples into close proximity to the PCWS for analysis.

FIG. 11 depicts a photonic crystal waveguide detector PCWD element wherein the photonic carrier signal moving through input port 1090 propagates through nanowire 960 into thermal micro-platform 920 where it thermally dissipates into photonic termination structure 1163. The underlying cavity 921 is bounded by periphery 925 contained within the off-platform support structure. Seebeck thermoelectric devices 1160 and 1161, depicted with four electrically-conducting nanowires, sense the incremental heating of micro-platform 920 as the photonic carrier signal heats PCW structure 1163. The incremental increase of temperature of the micro-platform 920 is proportional to the optical power of the photonic carrier signal delivered into the termination 1163.

In other embodiments of the PCWD, the dissipative termination structure 1163 of FIG. 11 is replaced with dissipative structures comprising, without limitation, resonant RLC loops, low-Q photonic crystal resonators, and a field of nanotubes. In other embodiments, the temperature sensing devices in the PCWD may comprise pyroelectric, thermistor, VOx and MOST devices. In some embodiments, thermoelectric devices depicted as structure 1162, 1164 are operated as Peltier thermoelectric coolers for reducing the steady-state temperature of platform 920. This cooling reduces noise of thermal origin in the sensing devices disposed on platform 925. In other embodiments, structures 1162 and 1164 comprise resistive heaters for outgassing the micro-platform 920 providing an advantageous cleaning function for the PCW termination 1163.

FIG. 12A depicts a spectrophotometer 1200A comprising three photonic elements 100A, 1000A and 1100 and two micro-platforms. Photonic elements PCWS and PCWD comprise separate thermal micro-platforms. In FIG. 12B, PS 100A depicts a photonic Bragg grating receiving photonic carrier signal from the remainder of the PS which is disposed off-chip. In applications, this embodiment provides a spectrophotometer sensitive to an analyte exposed to the sensor PCWS 1000A. The off-chip portion of the PS in embodiments is comprised of an LEP, LED, OLED, or laser including a quantum cascade laser.

FIG. 13A depicts another spectrophotometer comprising four photonic elements. A source PS 100A originates a photonic carrier signal which propagates through PCWF 900A, continues through PWCS 1000A and terminates into PCWD 1100. In applications, this embodiment provides a spectrophotometer sensitive to an analyte exposed to the sensor PCWS 1000A.

FIG. 13B depicts a plan view 1300B of the spectrophotometer 1300A of FIG. 13A. Three PCW coupling structures link the four photonic elements of the spectrophotometer. In this embodiment, the PCWF, PCWS and PCWD correspond to and comprise an IP & P integration of photonic elements disclosed in FIGS. 9A, 10B, and 11, respectively. In exemplary embodiments, the spectrometer of FIGS. 13A and 13B can comprise a single silicon substrate FIG. 14A depicts a spectrophotometer comprising three photonic elements, a first chip comprising a Bragg grating 100A receiving a photonic carrier signal and a second element comprised of a single thermal micro-platform 1450. The single platform comprises a PCWS and PCWD. The PCWS and PCWD are combined as a single IP & P structure as depicted in the plan view of FIG. 12B.

FIG. 14B depicts a spectrophotometer comprises four photonic elements, the first photonic element comprises a Bragg grating 100A, a second photonic element comprises a PCWF 900A and the third and fourth photonic elements 1450 PCWS, PCWD comprise a single thermal micro-platform. Source element PS 100A provides a photonic carrier signal through a PW and PCW guide into PCWF 900A. Photonic elements PCWF 900A and PCWS, PCWD 1450 are photonically connected through a PCW. The PCWF 900A comprises embodiments as depicted by the PCWF of FIG. 9B. The combined PCWS-PCWF 1450 comprise an IP & P structure further comprised of a single thermal micro-platform.

FIG. 15 is a plan view depicting another embodiment spectrophotometer 1500 wherein a single substrate comprises a Bragg grating 100A of the PS and an IP & P structure further comprising photonic elements PCWS and PCWD. Photonic elements PCWS and PCWD comprise separate micro-platforms within the same suspended structure 920. The PCWS and PCWD are photonically linked through the interposer PCW nanowire 1570 supported separately from the PCWS and PCWD. The shared interposer nanowire PCW 1570 extends fully across IP & P structure 920, wherein the IP & P structure is supported by nanowire 1560 and nanowires within thermal devices 1631, 1632 and 1580.

In operation, the photonic carrier signal from Bragg grating 100A propagates into photonic waveguide PW 1502 and continues into structure 1530 comprising a PCW nanowire 1560 and a Mach-Zehnder interferometer of the PCWS photonic element. The photonic carrier signal continues through the IP & P interposer nanowire 1570 into the PCWD which comprises a dissipative photonic termination 1561. This spectrophotometer is sensitive to an analyte exposed to the Mach-Zehnder interferometer.

The thermal elements 1631, 1632, 1580 within the spectrophotometer of FIG. 15 in embodiments comprise variously a temperature sensor, a resistive heater and a Peltier cooler. In a preferred embodiment, the temperature sensor comprises a thermoelectric Seebeck device.

The schematic of FIG. 16 depicts a more highly integrated IP & P system-on-chip SoC embodiment comprising multiple photonic elements on chip 1600 to provide a more complex spectrophotometer 1600. In this embodiment, each PCWD comprises a separate thermal micro-platform. The other thermal elements ado not comprise a thermal micro-platform. All thermal elements are connected with PCWs. In this embodiment, each of three photonic sources PS 100A, 100B, 100C provide a photonic carrier signal which propagates through a photonic guide PW or PCW into five PCWS elements 900A, 1000A. Each PCWS element feeds a photonic carrier signal into a PCWD 1100 through a PW or PCW connector guide. The source PS 100A with an optical fan-out of 1 provides a single-ended photonic signal through a PCWS into a termination PCWD.

In embodiments of the spectrophotometer of FIG. 16, the five separate PCWS elements can be exposed to an analyte or operated as a reference without exposure to an analyte. The sources PS 100B are structured with an optical fan-out of 2 support a differential analysis of photonic carrier signals based on one or more reference analytes and analytes of interest.

In the embodiment of FIG. 17, the integrated thermal sensor is configured as a spectrophotometer 1700 comprising two PCWF elements 900A to provide two separate wavelength channels into the PCWS 1750 wherein the PS provides a broadband photonic carrier signal. For example, these filtered signals delivered into the PCWS 1750 may comprise different channels providing sensitivity to different analytes. The photonic carrier signal selected by the two PCWF filters propagates through a sensor PCWS 1750 element and on into a detector PCWD 1100 element. In embodiments, the PCWFs may comprise a heater device for wavelength channel switching. In embodiments a heater device may provide outgassing for the PCWS and PCWD. The PCWF 900A and PCWD 1100 comprise thermal micro-platforms. The PCWD will typically comprise a sensitive temperature sensing device for photonic signal detection and in a preferred embodiment the PCWD comprises a Peltier thermoelectric device. In embodiments wherein may comprise a heater device modulation and a sensitive temperature sensor device for detection. In some embodiments wherein the photonic signal is in the visible or NIR wavelength range, the photonic carrier signal is detected in the PWCD with a pn junction bandgap diode.

In embodiments with the spectrometer of FIG. 17, the PS photonic carrier signal is a continuous CW signal. A PCWF 900A periodically chops the photonic carrier signal to support a form of synchronous detection for improving the overall signal-to-noise level of the detected PCWD 1100 signal. This chip in embodiments provides support for implementing dual wavelength spectral analysis wherein an analyte is exposed to the PCWS 1750. In this embodiment, the detector PCWD 1100 is designed with adequate bandwidth to terminate signals from the PCWS 1750 over an adequate wavelength range.

FIG. 18 depicts an embodiment wherein the integrated thermal sensor 1820 is clipped to a mobile phone 1810 with connection into the USB bus 1830 of the phone is depicted in FIG. 18. The spectrophotometer communicates with and receives DC power from the mobile phone typically through USB bus 1830. In another embodiment, the spectrometer communicates with the mobile phone through a wireless means which may include a Bluetooth or optical link.

FIG. 19A depicts a plan view of a photonic source PS 1900A comprising a light emitting platform (LEP) providing a photonic carrier signal that couples into an interposer PCW 1950 through a tapered waveguide PW 1940. In this embodiment the LEP photonic source shares the same substrate with one or more of the other photonic elements. The LEP comprises a thermal micro-platform 1920 supported by nanowires of type 1980 disposed within thermal devices 1970 and 1975. The thermal micro-platform 1920 is disposed over cavity 1930 with boundary 1910 and surrounded by an off-platform support structure 1960. In embodiments, one thermal device is a resistive heater and the other thermal device is a thermistor.

The thermal micro-platform 1920 is heated to provide a blackbody source of radiation which is filtered through metamaterial disposed into the thermal micro-platform. The micro-platform comprises a layered metamaterial sandwich of photonic structure comprising three layers. A first layer comprises a 2-D array of plasmonic ALD metal resonators 1902 arranged in a periodic fashion over a dielectric film 1990. These resonators couple with the thermal energy supplied by the heater to provide a photonic carrier signal of limited bandwidth exiting into tapered photonic waveguide (PC) 1940. These resonators comprise one or more of split ring resonators (SRR), surface plasmon particles (SPP), 1-D Bragg grating and LC resonant structures. These resonators concentrate electromagnetic fields according to the size and shape of the patterned ALD structure, the permittivity of the platform dielectric and temperature. In a preferred embodiment, the dielectric film 1990 is formed of the active layer of a silicon SOI wafer. In other embodiments, an ALD metal film is disposed under the dielectric film.

FIG. 19B depicts a view cross-section a-a' of emitters 1900A and 1900B from FIG. 19A depicting the released micro-platform 1920 and an underlying topside-etched cavity 1930. Micro-platform 1920 comprises the photonic resonator elements. A buried oxide (BOX) layer 1915 of a starting silicon SOI wafer is sandwiched between the device layer 1925 and a handle wafer 1935.

A method for operating the integrated thermal sensor wherein the photonic elements PS, PCWF, PCWS and PCWD are configured as a spectrophotometer and wherein the operation comprises:

providing a photonic signal from a photonic source (PS) within one or more wavelength bands;

exposing the photonic crystal waveguide sensor (PCWS) to two analytes comprising a reference analyte and an analyte of interest, wherein obtaining signal levels from the photonic crystal waveguide detector (PCWD) comprising a first measurement of signal level based on the reference analyte and a second measurement of signal level based on the analyte of interest;

defining a difference signal based on the difference in the first and second signal levels, and analyzing the differential signal to provide detection and/or monitoring of the analyte of interest.

It is to be understood that although the disclosure teaches many examples of embodiments in accordance with the present teachings, many additional variations of the invention can easily be devised by those skilled in the art after reading this disclosure. As a consequence, the scope of the present invention is to be determined by the following claims.

The invention claimed is:

1. An integrated photonic crystal sensor (IPCS) comprising photonic elements, including:

a photonic source (PS), a photonic crystal waveguide sensor (PCWS) comprising a photonic crystal (PC), and a photonic crystal waveguide detector (PCWD); and a photonic carrier signal created in the PS that propagates from the PS into and through the PCWS, and terminates in the PCWD, wherein the PCWD receives the photonic carrier signal that propagates through the PCWS and detects an amplitude of the photonic carrier signal, wherein the PCWD is sensitive to the amplitude and wherein the photonic carrier signal is propagated between the photonic elements through separate photonic waveguide (PW) or photonic crystal waveguide (PCW) interposer structures, wherein the PCWS is sensitive to an analyte by way of a detected change in amplitude of the photonic carrier signal wherein the photonic carrier signal is propagated between the photonic elements through separate photonic waveguide (PW) or photonic crystal waveguide (PCW) interposer structures, and further including one or more micro-platforms supported by nanowires in which the one or more micro-platforms is at least partially supported from a surrounding substrate by multiple electrically-conducting phononic nanowires, the one or more micro-platforms comprising one or more of the PS, PCWS, and PCWD wherein said phononic nanowires comprise a layer of crystalline semiconductor further comprising a phononic structure, wherein the phononic structure comprises phonon scattering sites and/or phononic crystal, wherein the layer reduces thermal conductivity and wherein the PS, PCWS, and PCWD are configured to identify a molecular species of the analyte.

2. The IPCS of claim 1 wherein the carrier signal propagates between photonic elements via a photonic waveguide (PW) interposer or photonic crystal waveguide (PCW) interposer.

3. The IPCS of claim 1 wherein one or more photonic elements comprise a resistively heated micro-platform powered from an external source, thereby providing control for a photonic signal amplitude, photonic signal wavelength passband, and platform surface outgassing.

4. The IPCS of claim 1 wherein one or more of the micro-platforms is disposed in an environment reducing convective and conductive thermal heat transport to or from the one or more micro-platforms is reduced for the purpose of self-cooling through spontaneous blackbody radiation.

5. The IPCS of claim 1 wherein one or more of the micro-platforms is cooled by an integral Peltier thermoelectric device.

6. The IPCS of claim 1 wherein the PS comprises a light emitting platform (LEP) and is adapted with a resonant filter split ring resonator (SRR), photonic Bragg grating or LC resonant circuit to provide an infrared photonic carrier signal of reduced bandwidth.

7. The IPCS of claim 1 wherein the first layer of the phononic nanowires comprises a random or periodic deposition of phonon scattering sites within or on the surface of said phononic nanowires, and further wherein the phonon scattering sites are physically separated by distances less than a mean-free-path of heat conducting phonons, thereby reducing thermal conductivity.

8. The IPCS of claim 1 wherein a layer of the phononic nanowires comprises phononic crystal characterized by a phononic bandgap, thereby reducing thermal conductivity.

9. The IPCS of claim 1 wherein a layer of the phononic nanowires comprise one or more of multiple holes, cavities, phononic Bragg line structure, atomic-level superlattices, atomic-level vacancies and implanted particulates disposed physically in random or periodic fashion.

10. The IPCS of claim 1 wherein one or more of the phononic nanowires is comprised of one or more additional layers comprising a metallic atomic layer deposition (ALD) layer for increasing electrical conductivity or mechanical stress control.

11. The IPCS of claim 1 wherein the photonic carrier signal from the PS comprises at least one infrared wavelength band and within an infrared spectral wavelength range.

12. The IPCS of claim 1 wherein the PS comprises one or more of a light emitting platform (LEP), light emitting diode (LED), OLED or laser.

13. The IPCS of claim 1 wherein the PS comprises a heated micro-platform, the micro-platform further comprising a heated blackbody source of radiation structured with one or more of a split ring resonator (SRR), surface plasmon particles, 1-D Bragg grating and LC resonant structure to create a photonic carrier signal of limited bandwidth.

14. The ICPS of claim 1 further adapted with a photonic crystal waveguide filter (PCWF) comprising an additional photonic element disposed into the photonic carrier signal interposer path between the PS and the PCWS, wherein the PCWF modulates the amplitude of the photonic carrier signal.

15. The IPCS of claim 1 wherein an electromagnetic field created by the photonic crystal (PC) structure within the PCWS penetrates into and electromagnetically couples with the molecular structure of the exposed analyte, wherein the coupling modulates the amplitude of the photonic carrier signal.

16. The IPCS of claim 15 wherein the PC of the PCWS is structured with photonic defect sites thereby increasing said coupling.

17. The IPCS of claim 15 wherein the PC structure of the PCWS is configured for slow-wave propagation of the photonic carrier signal thereby increasing said coupling.

18. The IPCS of claim 15 wherein the PC of the PCWS is configured as a Mach-Zehnder interferometer.

19. The IPCS of claim 15 wherein the PCWS is configured with photonic structure sensitive to one or more of a molecular species contained within the exposed analyte, including toxic gas species, volatile hydrocarbons, and complex molecules.

20. The IPCS of claim 1 wherein the PCWD comprises a micro-platform thermally isolated by phononic nanowires and structured with a device for sensing temperature of the micro-platform, wherein the micro-platform is heated by absorption of the photonic carrier signal.

21. The IPCS of claim 20 wherein the temperature sensing device comprises one or more of a Seebeck thermoelectric, pyroelectric, thermistor and MOST device.

22. The IPCS of claim 1 wherein the PCWD comprises a pn junction bandgap diode sensitive to wavelengths over a range from 0.3 micrometers into the infrared range.

23. The IPCS of claim 1 wherein the PS is a narrowband, noncoherent light emitting platform (LEP) supplying a photonic carrier signal comprised of one or more wavelength bands of infrared with the IPCS further configured for operation as an infrared spectrophotometer.

24. The IPCS of claim 1 wherein the PS, PCWS, and PCWD are disposed on a common semiconductor or ceramic substrate.

* * * * *